US010672237B2

(12) United States Patent
Tso

(10) Patent No.: US 10,672,237 B2
(45) Date of Patent: Jun. 2, 2020

(54) DOORBELL SOUND OUTPUT DEVICE CONTROLLERS, DOORBELL SWITCHES, AND ASSOCIATED SYSTEMS AND METHODS

(71) Applicant: AMAZON TECHNOLOGIES, INC., Seattle, WA (US)

(72) Inventor: Robert Tso, Los Angeles, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/357,083

(22) Filed: Mar. 18, 2019

(65) Prior Publication Data

US 2019/0213847 A1     Jul. 11, 2019

Related U.S. Application Data

(63) Continuation of application No. 15/868,920, filed on Jan. 11, 2018, now Pat. No. 10,304,296.
(Continued)

(51) Int. Cl.
*G08B 3/00* (2006.01)
*G08B 3/10* (2006.01)
(Continued)

(52) U.S. Cl.
CPC ........... *G08B 3/10* (2013.01); *H03K 17/6871* (2013.01); *H03K 17/785* (2013.01);
(Continued)

(58) Field of Classification Search
None
See application file for complete search history.

(56) References Cited

U.S. PATENT DOCUMENTS

| 4,764,953 A | 8/1988 | Chern et al. |
| 5,210,520 A * | 5/1993 | Housley ................... G08B 3/10 340/326 |

(Continued)

FOREIGN PATENT DOCUMENTS

| CN | 2585521 Y | 11/2003 |
| CN | 2792061 Y | 6/2006 |

(Continued)

OTHER PUBLICATIONS

PCT/US2018/013341 International Search Report and Written Opinion dated May 2, 2018, 14 pages.

*Primary Examiner* — John F Mortell
(74) *Attorney, Agent, or Firm* — Lathrop GPM LLP

(57) ABSTRACT

A doorbell switch includes a user input device configured to receive a user command to activate a doorbell sound output device, and activation circuitry configured to generate an activation signal in response to the user input device receiving the user command to activate the doorbell sound output device. A doorbell sound output device controller includes a switching device configured to control flow of electrical current between the doorbell sound output device controller and the doorbell sound output device, and control circuitry configured to control the switching device to enable flow of electrical current between the doorbell sound output device controller and the doorbell sound output device in response to receiving the activation signal from the doorbell switch.

17 Claims, 20 Drawing Sheets

Related U.S. Application Data

(60) Provisional application No. 62/445,184, filed on Jan. 11, 2017.

(51) Int. Cl.
*H03K 17/687* (2006.01)
*H03K 17/785* (2006.01)
*H03K 17/94* (2006.01)
*H03K 17/96* (2006.01)
G08B 13/196 (2006.01)

(52) U.S. Cl.
CPC ......... *H03K 17/941* (2013.01); *H03K 17/962* (2013.01); *G08B 13/19695* (2013.01); *H03K 2217/0009* (2013.01); *H03K 2217/0081* (2013.01); *H03K 2217/94089* (2013.01)

(56) References Cited

U.S. PATENT DOCUMENTS

| | | |
|---|---|---|
| 5,428,388 A | 6/1995 | Von Bauer et al. |
| 5,760,848 A | 6/1998 | Cho |
| 5,894,262 A * | 4/1999 | McCavit ............... H02J 13/00 340/328 |
| 6,072,402 A | 6/2000 | Kniffin et al. |
| 6,192,257 B1 | 2/2001 | Ray |
| 6,271,752 B1 | 8/2001 | Vaios |
| 6,366,060 B1 * | 4/2002 | Ely ........................ H02P 9/48 322/25 |
| 6,429,893 B1 | 8/2002 | Xin |
| 6,456,322 B1 | 9/2002 | Marinacci |
| 6,476,858 B1 | 11/2002 | Ramirez Diaz et al. |
| 6,633,231 B1 | 10/2003 | Okamoto et al. |
| 6,658,091 B1 | 12/2003 | Naidoo et al. |
| 6,753,774 B2 | 6/2004 | Pan et al. |
| 6,970,183 B1 | 11/2005 | Monroe |
| 7,062,291 B2 | 6/2006 | Ryley et al. |
| 7,065,196 B2 | 6/2006 | Lee |
| 7,085,361 B2 | 6/2006 | Lee |
| 7,109,860 B2 | 9/2006 | Wang |
| 7,193,644 B2 | 3/2007 | Carter |
| 7,304,572 B2 | 12/2007 | Sheynman et al. |
| 7,382,249 B2 | 6/2008 | Fancella |
| 7,450,638 B2 | 11/2008 | Iwamura |
| 7,643,056 B2 | 1/2010 | Silsby |
| 7,683,924 B2 | 3/2010 | Oh et al. |
| 7,683,929 B2 | 3/2010 | Elazar et al. |
| 7,738,917 B2 | 6/2010 | Ryley et al. |
| 8,058,976 B2 | 11/2011 | Ortiz et al. |
| 8,139,098 B2 | 3/2012 | Carter |
| 8,144,183 B2 | 3/2012 | Carter |
| 8,154,581 B2 | 4/2012 | Carter |
| 8,619,136 B2 | 12/2013 | Howarter et al. |
| 8,780,201 B1 | 7/2014 | Scalisi et al. |
| 8,823,795 B1 | 9/2014 | Scalisi et al. |
| 8,842,180 B1 | 9/2014 | Kasmir et al. |
| 8,872,915 B1 | 10/2014 | Scalisi et al. |
| 8,937,659 B1 | 1/2015 | Scalisi et al. |
| 8,941,736 B1 | 1/2015 | Scalisi |
| 8,947,530 B1 | 2/2015 | Scalisi |
| 8,953,040 B1 | 2/2015 | Scalisi et al. |
| 9,013,575 B2 | 4/2015 | Scalisi |
| 9,049,352 B2 | 6/2015 | Scalisi et al. |
| 9,053,622 B2 | 6/2015 | Scalisi |
| 9,058,738 B1 | 6/2015 | Scalisi |
| 9,060,103 B2 | 6/2015 | Scalisi |
| 9,060,104 B2 | 6/2015 | Scalisi |
| 9,065,987 B2 | 6/2015 | Kasmir et al. |
| 9,094,584 B2 | 7/2015 | Scalisi et al. |
| 9,113,051 B1 | 8/2015 | Scalisi |
| 9,113,052 B1 | 8/2015 | Scalisi et al. |
| 9,118,819 B1 | 8/2015 | Scalisi et al. |
| 9,142,214 B2 | 9/2015 | Scalisi |
| 9,160,987 B1 | 10/2015 | Kasmir et al. |
| 9,165,444 B2 | 10/2015 | Scalisi |
| 9,172,920 B1 | 10/2015 | Kasmir et al. |
| 9,172,921 B1 | 10/2015 | Scalisi et al. |
| 9,172,922 B1 | 10/2015 | Kasmir et al. |
| 9,179,107 B1 | 11/2015 | Scalisi et al. |
| 9,179,108 B1 | 11/2015 | Scalisi et al. |
| 9,179,109 B1 | 11/2015 | Kasmir et al. |
| 9,196,133 B2 | 11/2015 | Scalisi et al. |
| 9,197,867 B1 | 11/2015 | Scalisi et al. |
| 9,230,424 B1 | 1/2016 | Scalisi et al. |
| 9,237,318 B2 | 1/2016 | Kasmir et al. |
| 9,247,219 B2 | 1/2016 | Kasmir et al. |
| 9,253,455 B1 | 2/2016 | Harrison et al. |
| 9,342,936 B2 | 5/2016 | Scalisi |
| 9,508,239 B1 | 11/2016 | Harrison et al. |
| 9,736,284 B2 | 8/2017 | Scalisi et al. |
| 9,743,049 B2 | 8/2017 | Scalisi et al. |
| 9,769,435 B2 | 9/2017 | Scalisi et al. |
| 9,786,133 B2 | 10/2017 | Harrison et al. |
| 9,799,183 B2 | 10/2017 | Harrison et al. |
| 2002/0094111 A1 | 7/2002 | Puchek et al. |
| 2002/0147982 A1 | 10/2002 | Naidoo et al. |
| 2003/0043047 A1 | 3/2003 | Braun |
| 2004/0085205 A1 | 5/2004 | Yeh |
| 2004/0085450 A1 | 5/2004 | Stuart |
| 2004/0086093 A1 | 5/2004 | Schranz |
| 2004/0095254 A1 | 5/2004 | Maruszczak |
| 2004/0135686 A1 | 7/2004 | Parker |
| 2005/0013075 A1 * | 1/2005 | Kohlmeier-Beckmann ................ H02J 13/00009 361/62 |
| 2005/0111660 A1 | 5/2005 | Hosoda |
| 2006/0010199 A1 | 1/2006 | Brailean |
| 2006/0022816 A1 | 2/2006 | Yukawa |
| 2006/0139449 A1 | 6/2006 | Cheng et al. |
| 2006/0156361 A1 | 7/2006 | Wang et al. |
| 2007/0008081 A1 | 1/2007 | Tylicki et al. |
| 2007/0052531 A1 | 3/2007 | Matthews et al. |
| 2010/0225455 A1 | 9/2010 | Claiborne et al. |
| 2013/0057695 A1 | 3/2013 | Huisking |
| 2014/0005834 A1 * | 1/2014 | Hoffman ............. G05B 19/042 700/275 |
| 2014/0267716 A1 | 9/2014 | Child et al. |
| 2015/0035987 A1 | 2/2015 | Fernandez |
| 2015/0145993 A1 | 5/2015 | Scalisi |
| 2015/0163463 A1 | 6/2015 | Hwang et al. |
| 2017/0332055 A1 * | 11/2017 | Henderson ............. H04N 7/186 |

FOREIGN PATENT DOCUMENTS

| | | |
|---|---|---|
| CN | 1704985 A | 12/2006 |
| EP | 0944883 B1 | 6/1998 |
| EP | 1480462 A1 | 11/2004 |
| GB | 2286283 A | 8/1995 |
| GB | 2354394 A | 3/2001 |
| GB | 2357387 A | 6/2001 |
| GB | 2400958 A | 10/2004 |
| JP | 2001-103463 A2 | 4/2001 |
| JP | 2002-033839 A2 | 1/2002 |
| JP | 2002-125059 A2 | 4/2002 |
| JP | 2002-342863 A2 | 11/2002 |
| JP | 2002-344640 A2 | 11/2002 |
| JP | 2002-354137 A2 | 12/2002 |
| JP | 2002-368890 A2 | 12/2002 |
| JP | 2003-283696 A2 | 10/2003 |
| JP | 2004-128835 A | 4/2004 |
| JP | 2005-341040 A | 12/2005 |
| JP | 2006-147650 A | 6/2006 |
| JP | 2006-262342 A | 9/2006 |
| JP | 09-008925 A | 1/2009 |
| WO | WO 199839894 A1 | 9/1998 |
| WO | WO 0113638 A1 | 2/2001 |
| WO | WO 200193220 A1 | 12/2001 |
| WO | WO 2002085019 A1 | 10/2002 |
| WO | WO 2003028375 A1 | 4/2003 |
| WO | WO 2003096696 A1 | 11/2003 |
| WO | WO 2006038760 A1 | 4/2006 |

(56) References Cited

FOREIGN PATENT DOCUMENTS

| WO | WO 2006067782 A1 | 6/2006 |
|----|------------------|--------|
| WO | WO 2007125143 A1 | 8/2007 |

* cited by examiner

DOORBELL SOUND OUTPUT DEVICE CONTROLLERS, DOORBELL SWITCHES, AND ASSOCIATED SYSTEMS AND METHODS

RELATED APPLICATIONS

This application is a continuation of U.S. patent application Ser. No. 15/868,920, filed on Jan. 11, 2018, which claims benefit of priority to U.S. Provisional Patent Application Ser. No. 62/445,184, filed on Jan. 11, 2017. Each of the above-mentioned applications is incorporated herein by reference.

BACKGROUND

Doorbells are widely used in buildings, such as to enable visitors to announce their presence. FIG. 1 schematically illustrates a prior-art doorbell system 100 including a step-down transformer 102, a doorbell switch 104, and a mechanical doorbell sound output device 106. A primary winding 108 of the transformer 102 is electrically coupled to an alternating current (AC) electrical power source (not shown), and a secondary winding 110 of the transformer 102 is electrically coupled in series with the doorbell switch 104 and the doorbell sound output device 106.

The doorbell switch 104 is normally open, and electrical current therefore normally does not flow through the mechanical doorbell sound output device 106. When the doorbell switch 104 is pressed such that the switch is closed, electrical current flows through and energizes the mechanical doorbell sound output device 106. Typically, this action produces a "ding" sound. When the doorbell switch 104 is released such that the switch is opened, a plunger of the mechanical doorbell sound output device 106 strikes a lower pitched metal plate, producing a "dong" sound. The mechanical doorbell sound output device 106 is schematically depicted herein as a solenoid coil, and mechanical aspects are not shown to promote illustrative clarity.

FIG. 2 schematically illustrates another prior-art doorbell system 200. The doorbell system 200 is similar to the doorbell system 100 of FIG. 1, except that the mechanical doorbell sound output device 106 is replaced with an electronic doorbell sound output device 206, and a semiconductor diode 212 is electrically coupled in parallel with the doorbell switch 104. The semiconductor diode 212 provides half-wave rectified direct current (DC) electrical power to the electronic doorbell sound output device 206, thereby enabling the doorbell sound output device 206 to be ready to receive a trigger signal. When the doorbell switch 104 is closed, the electronic doorbell sound output device 206 is triggered by the presence of an AC electrical current waveform flowing through the doorbell sound output device. When the doorbell switch 104 is released, DC electrical power is again provided to the electronic doorbell sound output device 206, thereby electrically powering the electronic doorbell sound output device 206 and enabling the doorbell sound output device to continue to play a sound output device melody lasting a few to several seconds, even if the trigger signal is shorter than one second. Many electronic doorbell sound output devices on the market today operate in this manner, requiring a diode (e.g., the diode 212) connected across the doorbell switch.

SUMMARY

One aspect of the present embodiments includes the realization that closure of a switching device in a conventional doorbell switch electrically bypasses a power supply of the doorbell switch. Consequently, if the doorbell switch is to operate continuously, a battery or other energy storage device must be provided to power the doorbell switch while the switching device is closed. The present embodiments solve this problem by generating an activation signal in a doorbell switch without interfering with power supply circuitry operation in the doorbell switch, and enabling flow of electrical current between a doorbell sound output device controller and a doorbell sound output device in response to receiving the activation signal at the doorbell sound output device controller. Doorbells including features of the present embodiments thus do not require a battery or other energy storage device to power the doorbell switch while the switching device is closed, which not only simplifies the structure of such doorbells, but also enables doorbells of the present embodiments to avoid drawbacks associated with batteries, such as their limited lifespan and poor cold weather performance.

In a first aspect, a doorbell sound output device controller includes (a) a switching device configured to control flow of electrical current between the doorbell sound output device controller and a doorbell sound output device and (b) control circuitry. The control circuitry is configured to control the switching device to enable flow of electrical current between the doorbell sound output device controller and the doorbell sound output device in response to receiving an activation signal from a doorbell switch external to the doorbell sound output device controller.

In some embodiments of the first aspect, the control circuitry includes a receiver configured to receive the activation signal from the doorbell switch.

In some embodiments of the first aspect, the receiver is configured to receive the activation signal via wiring electrically coupling the doorbell switch to the doorbell sound output device controller.

In some embodiments of the first aspect, the activation signal is selected from the group consisting of a simple tone and a modulated tone.

In some embodiments of the first aspect, the control circuitry includes current sense circuitry configured to receive the activation signal from the doorbell switch via a change in electrical current flowing between the doorbell sound output device controller and the doorbell switch.

In some embodiments of the first aspect, the current sense circuitry includes (a) an electrical conductor configured to be electrically coupled to the doorbell switch, and (b) a Hall effect sensor configured to sense a magnetic field generated by electrical current flowing through the electrical conductor.

In some embodiments of the first aspect, the control circuitry is further configured to detect the activation signal in response to a change in an amount of time that a magnitude of the electrical current flowing between the doorbell sound output device controller and the doorbell switch is zero.

In some embodiments of the first aspect, the control circuitry includes filtering circuitry configured to filter the activation signal from other signals received by the control circuitry.

In some embodiments of the first aspect, the control circuitry includes (a) a power supply configured to provide electric power to the control circuitry, and (b) driver circuitry configured to drive the switching device.

In some embodiments of the first aspect, the switching device is configured to be electrically coupled in series with the doorbell sound output device.

In some embodiments of the first aspect, the switching device includes a triac.

In some embodiments of the first aspect, the doorbell sound output device controller further includes a diode device electrically coupled in parallel with the switching device, such that the diode device provides a path for direct current between the doorbell sound output device controller and the doorbell sound output device.

In some embodiments of the first aspect, the switching device includes first and second metal oxide semiconductor field effect transistors electrically coupled in series, and the diode device is a body diode of the first metal oxide semiconductor field effect transistor.

In some embodiments of the first aspect, the control circuitry is further configured to receive a configuration command to cause the second metal oxide semiconductor field effect transistor to continuously operate in its conductive operating state, such that the body diode of the first metal oxide semiconductor field effect transistor provides a path for direct current between the doorbell sound output device controller and the doorbell sound output device.

In some embodiments of the first aspect, the control circuitry is further configured to receive the configuration command from the doorbell switch.

In some embodiments of the first aspect, the control circuitry is further configured to control a duration that the switching device operates in its conductive state in response to receiving the activation signal from the doorbell switch.

In some embodiments of the first aspect, the control circuitry is further configured to enable adjustment of the duration that the switching device operates in its conductive state in response to receiving the activation signal from the doorbell switch.

In a second aspect, a doorbell switch includes (a) a user input device configured to receive a user command to activate a doorbell sound output device, and (b) a transmitter configured to generate an activation signal on wiring electrically coupling the doorbell switch to a doorbell sound output device controller, in response to the user input device receiving the user command to activate the doorbell sound output device.

In some embodiments of the second aspect, the doorbell switch further includes power supply circuitry configured to (a) receive input electrical power via the wiring electrically coupling the doorbell switch to the doorbell sound output device controller and (b) electrically power the doorbell switch.

In some embodiments of the second aspect, the transmitter is further configured to generate the activation signal such that the activation signal is selected from the group consisting of a simple tone and a modulated tone.

In some embodiments of the second aspect, the user input device includes a touch-activated switch.

In some embodiments of the second aspect, the doorbell switch further includes a video camera configured to generate video image data representing a scene proximate to the doorbell switch.

In some embodiments of the second aspect, the doorbell switch further includes a microphone configured to generate sound data representing sound proximate to the doorbell switch.

In some embodiments of the second aspect, the doorbell switch further includes a speaker configured to generate sound in response to a signal received by the doorbell switch from a device external to the doorbell switch.

In a third aspect, a doorbell switch includes (a) a user input device configured to receive a user command to activate a doorbell sound output device, and (b) perturbation circuitry configured to generate an activation signal on wiring electrically coupling the doorbell switch to a doorbell sound output device controller by changing electrical current flowing through the wiring, in response to the user input device receiving the user command to activate the doorbell sound output device.

In some embodiments of the third aspect, the doorbell switch further includes power supply circuitry configured to (a) receive input electrical power via the wiring electrically coupling the doorbell switch to the doorbell sound output device controller and (b) electrically power the doorbell switch.

In some embodiments of the third aspect, the perturbation circuitry includes a perturbation switching device and an impedance device electrically coupled in series across the wiring electrically coupling the doorbell switch to the doorbell sound output device controller.

In some embodiments of the third aspect, the user input device includes a touch-activated switch.

In some embodiments of the third aspect, the doorbell switch further includes a video camera configured to generate video image data representing a scene proximate to the doorbell switch.

In some embodiments of the third aspect, the doorbell switch further includes a microphone configured to generate sound data representing sound proximate to the doorbell switch.

In some embodiments of the third aspect, the doorbell switch further includes a speaker configured to generate sound in response to a signal received by the doorbell switch from a device external to the doorbell switch.

In a fourth aspect, a doorbell includes a doorbell switch and a doorbell sound output device controller. The doorbell switch includes (a) a user input device configured to receive a user command to activate a doorbell sound output device, and (b) activation circuitry configured to generate an activation signal in response to the user input device receiving the user command to activate the doorbell sound output device. The doorbell sound output device controller includes (a) a switching device configured to control flow of electrical current between the doorbell sound output device controller and the doorbell sound output device, and (b) control circuitry configured to control the switching device to enable flow of electrical current between the doorbell sound output device controller and the doorbell sound output device in response to receiving the activation signal from the doorbell switch.

In some embodiments of the fourth aspect, the doorbell switch further includes power supply circuitry configured to (a) receive input electrical power via wiring electrically coupling the doorbell switch to the doorbell sound output device controller and (b) electrically power the doorbell switch.

In some embodiments of the fourth aspect, the activation circuitry includes a transmitter configured to generate the activation signal on the wiring electrically coupling the doorbell switch to the doorbell sound output device controller.

In some embodiments of the fourth aspect, the transmitter is further configured to generate the activation signal such that the activation signal is selected from the group consisting of a simple tone and a modulated tone.

In some embodiments of the fourth aspect, the activation circuitry is further configured to generate the activation signal by changing electrical current flowing through the wiring electrically coupling the doorbell switch to the doorbell sound output device controller.

In some embodiments of the fourth aspect, the activation circuitry includes a perturbation switching device and an impedance device electrically coupled in series across the wiring electrically coupling the doorbell switch to the doorbell sound output device controller.

In some embodiments of the fourth aspect, the doorbell switch further includes a video camera configured to generate video image data representing a scene proximate to the doorbell.

In some embodiments of the fourth aspect, the control circuitry of the doorbell sound output device controller includes a receiver configured to receive the activation signal from the doorbell switch via the wiring electrically coupling the doorbell switch to the doorbell sound output device controller.

In some embodiments of the fourth aspect, the control circuitry of the doorbell sound output device controller includes current sense circuitry configured to receive the activation signal from the doorbell switch via a change in electrical current flowing between the doorbell sound output device controller and the doorbell switch.

In some embodiments of the fourth aspect, the current sense circuitry includes: (a) an electrical conductor configured to be electrically coupled to the doorbell switch, and (b) a Hall effect sensor configured to sense a magnetic field generated by electrical current flowing through the electrical conductor.

In a fifth aspect, a method for operating a doorbell sound output device includes (a) generating an activation signal at a doorbell switch in response to a user command to activate the doorbell sound output device, (b) receiving the activation signal at a doorbell sound output device controller external to the doorbell switch, and (c) in response to receiving the activation signal at the doorbell sound output device controller, enabling flow of electrical current between the doorbell sound output device controller and the doorbell sound output device.

In some embodiments of the fifth aspect, the method further includes transmitting the activation signal from the doorbell switch to the doorbell sound output device controller via wiring electrically coupling the doorbell switch to the doorbell sound output device controller.

In some embodiments of the fifth aspect, the method further includes electrically powering the doorbell switch via the wiring electrically coupling the doorbell switch to the doorbell sound output device controller while transmitting the activation signal from the doorbell switch to the doorbell sound output device controller.

In some embodiments of the fifth aspect, generating the activation signal at the doorbell switch includes generating a tone selected from the group consisting of a simple tone and a modulated tone.

In some embodiments of the fifth aspect, generating the activation signal at the doorbell switch includes changing electrical current flowing through the wiring electrically coupling the doorbell switch to the doorbell sound output device controller.

In some embodiments of the fifth aspect, the method further includes generating video image data representing a scene proximate to the doorbell switch.

DETAILED DESCRIPTION OF THE EMBODIMENTS

Figure 1:
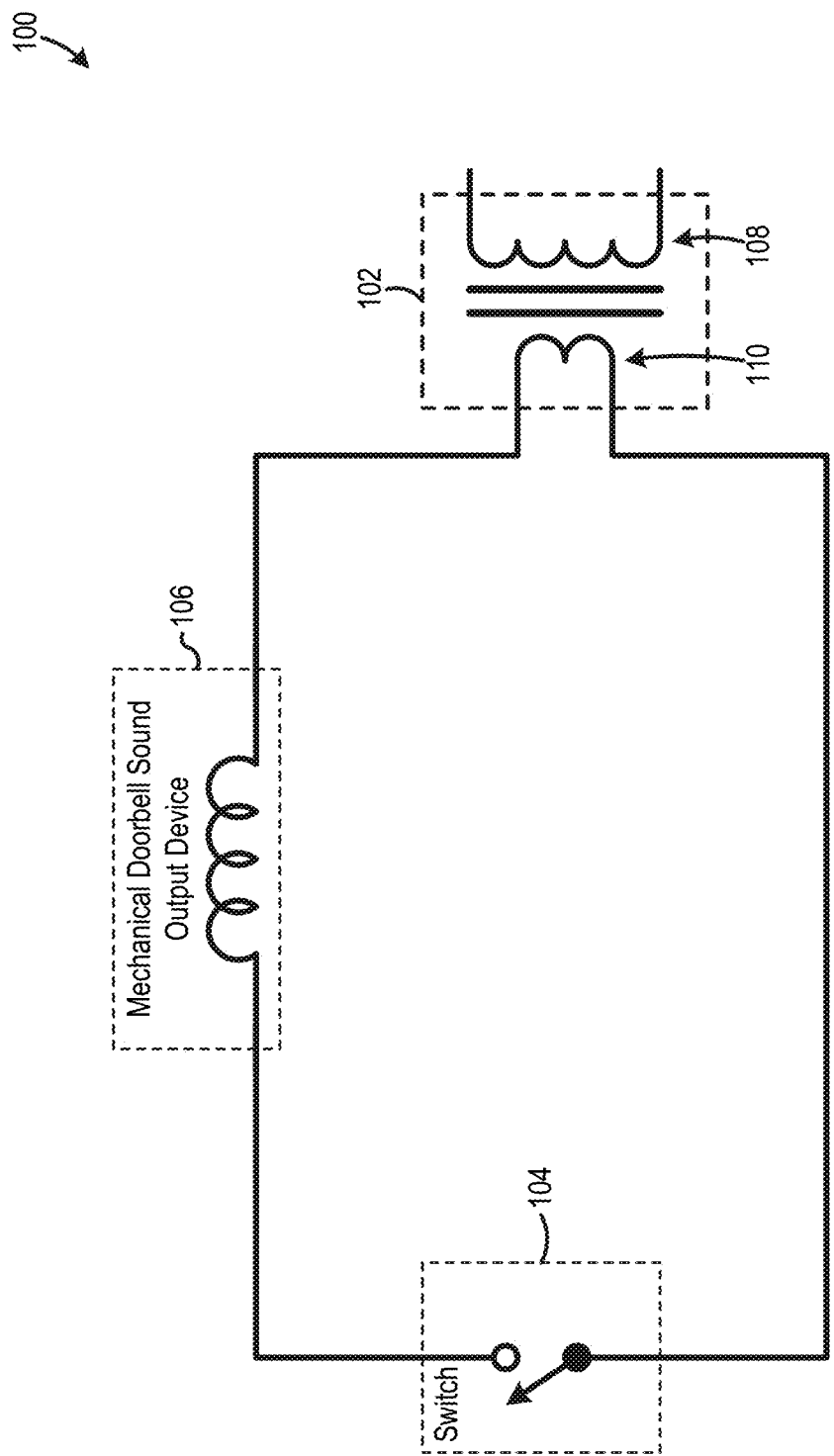
FIG. 1 is a schematic diagram illustrating a prior-art doorbell system including a mechanical doorbell sound output device.
Figure 2:
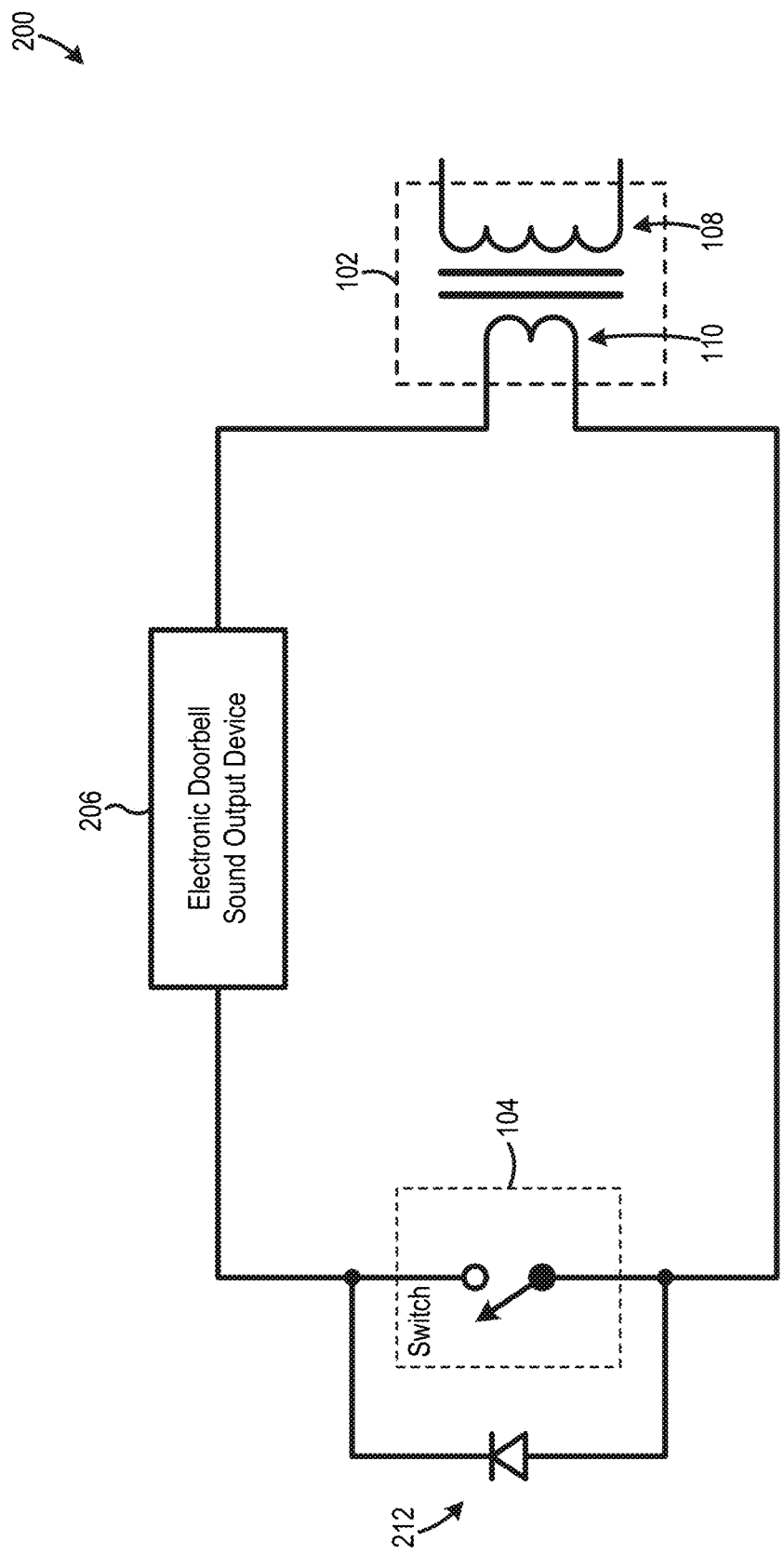
FIG. 2 is a schematic diagram illustrating a prior-art doorbell system including an electronic doorbell sound output device.
Figure 3:
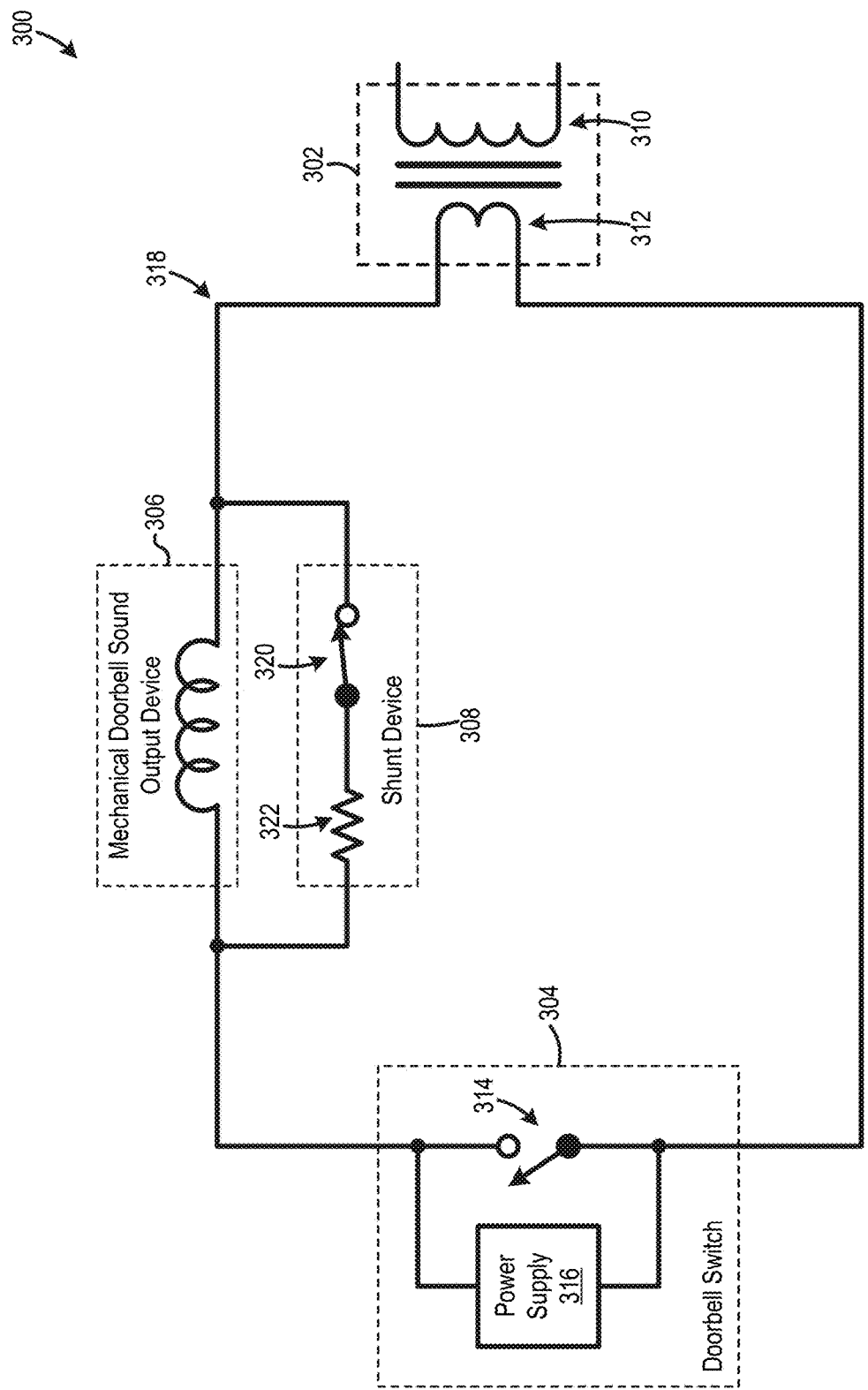
FIG. 3 is a schematic diagram illustrating a prior-art doorbell system including a shunt device.

Some modern doorbell switches consume significant electrical power and therefore must be used with a shunt device to achieve proper operation. For example, FIG. 3 illustrates a prior-art doorbell system 300 including a transformer 302, a doorbell switch 304, a mechanical doorbell sound output device 306, and a shunt device 308. A primary winding 310 of the transformer 302 is electrically coupled to an AC electrical power source (not shown), and a secondary winding 312 of the transformer 302 is electrically coupled in series with the doorbell switch 304 and the mechanical doorbell sound output device 306. The doorbell switch 300 includes a switching device 314 and a power supply 316. The switching device 314 is electrically coupled in series with the mechanical doorbell sound output device 306. The switching device 314 is normally open, and closing the switching device 314 enables electrical current to flow through the mechanical doorbell sound output device 306, thereby energizing the mechanical doorbell sound output device 306 and causing it to emit at least one tone. The power supply 316 electrically powers the doorbell switch 304, and the power supply 316 receives input electrical power from the transformer 302 via wiring 318 and the mechanical doorbell sound output device 306.

The shunt device 308 increases electrical power available to the doorbell switch 304. In particular, solenoid DC resistance of the mechanical doorbell sound output device 306 is typically about 8 to 12 ohms. This resistance significantly reduces available voltage and power from the transformer 302 to the doorbell switch 304, and the doorbell switch 304 may consume up to a few watts of power, depending on the operational state of the doorbell switch 304. Consequently, the doorbell switch 304 would likely not receive sufficient electrical power if the shunt device 308 were not present.

The shunt device 308 is electrically coupled in parallel with the mechanical doorbell sound output device 306, and the shunt device 308 includes a normally-closed switching device 320 and a current limiting resistor 322 electrically coupled in series. The shunt device 308 bypasses the mechanical doorbell sound output device 306 when the normally-closed switching device 320 is closed, thereby enabling the doorbell switch 304 to receive a greater voltage magnitude and a greater electrical power magnitude than would otherwise be possible if the shunt device 308 were not present. The shunt device 308 further includes control circuitry (not shown) to detect an increase in current flowing through the shunt device 308 in response to closing of the switching device 314, and the control circuitry causes the switching device 320 to open in response to the detected current increase. Opening the switching device 320 enables nearly all available power from the transformer 302 to be provided to the mechanical doorbell sound output device 306. Thus, the shunt device 308 enables each of the doorbell switch 304 and the mechanical doorbell sound output device 306 to receive sufficient electrical power for proper operation.

However, embodiments described herein include the realization that the doorbell system 300 has a significant negative aspect. In particular, closure of the switching device 314 during activation of the mechanical doorbell sound output device 306 electrically bypasses the power supply 316 of the doorbell switch 304. Consequently, the doorbell switch 304 cannot receive electrical power from the transformer 302 during this time. Thus, if the doorbell switch 304 is to operate continuously, a battery or other energy storage device must be provided to power the doorbell switch 304 while the switching device 314 is closed.

There are many disadvantages to powering the doorbell switch 304 from a battery or other energy storage device. For example, a battery has a limited lifespan, and battery performance is typically significantly reduced at cold temperatures. Indeed, commercial grade, rechargeable LiPo (lithium polymer) batteries are typically not allowed to charge at battery temperatures below 0° C., due to issues of battery damage and lifetime degradation. Doorbell switches are typically mounted outside of a building where weather conditions can easily be such that LiPo battery charging is not recommended. Additionally, presence of a rechargeable battery in the doorbell switch 304 typically requires battery management hardware and/or firmware, thus making the doorbell switch 304 relatively complicated and expensive. Accordingly, a doorbell switch that does not require a battery is advantageous over a doorbell switch that does require a battery.

Embodiments described herein include doorbell sound output device controllers, doorbell switches, and associated systems and methods that at least partially overcome one or more of the problems discussed above. The new doorbell switches include activation circuitry configured to generate an activation signal in response to a user command to activate a doorbell sound output device, and certain embodiments of the doorbell switches are capable of continuously operating without a battery or other energy storage device. The doorbell sound output device controllers include control circuitry configured to control a switching device to enable flow of electrical current between the doorbell sound output device controller and the doorbell sound output device in response to receiving the activation signal.

Figure 4:
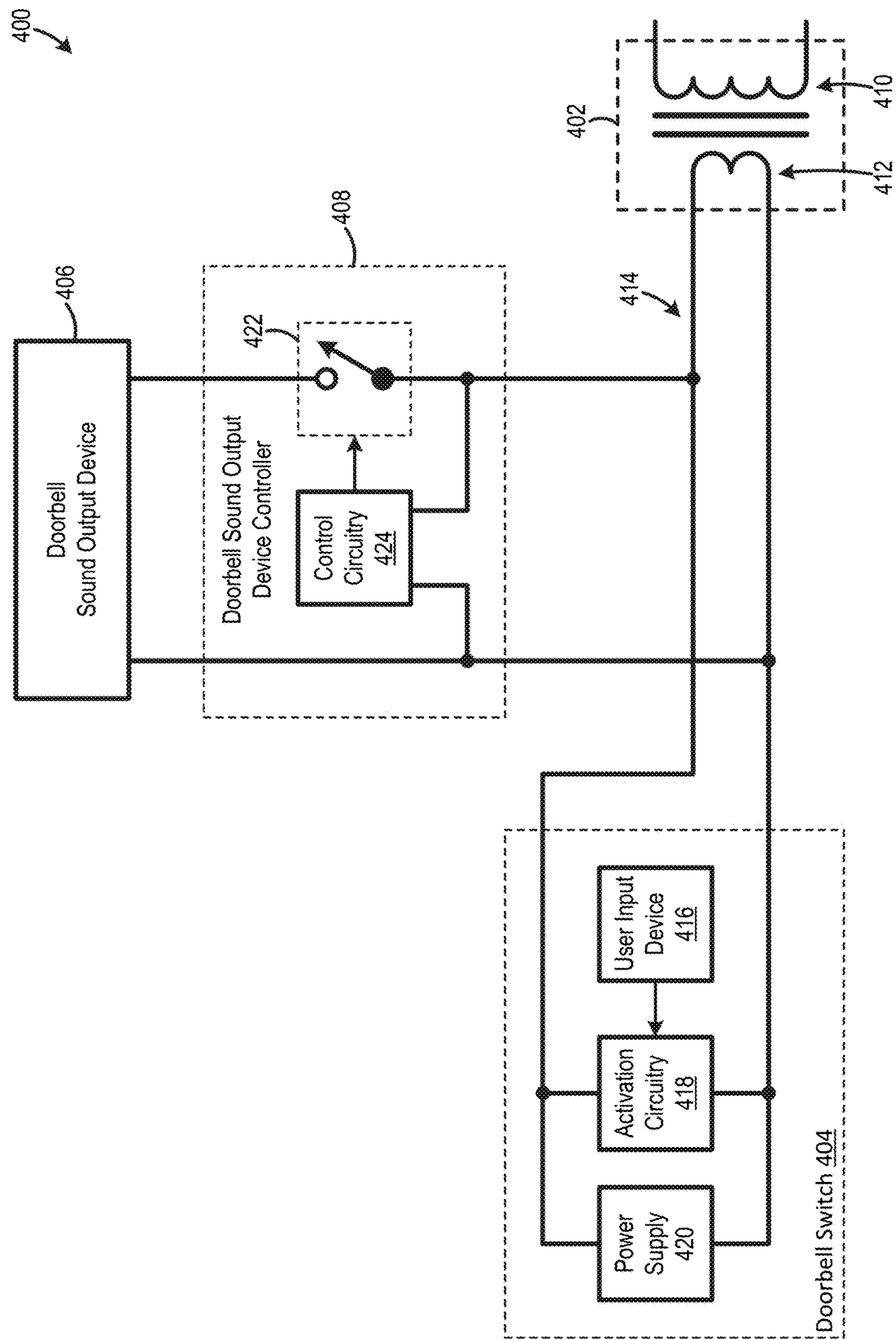
FIG. 4 is a schematic diagram illustrating a doorbell system including a doorbell sound output device controller, according to an embodiment.

FIG. 4 illustrates a doorbell system 400 including an embodiment of the present doorbell switches and an embodiment of the present doorbell sound output device controller. The doorbell system 400 includes a transformer 402, a doorbell switch 404, a doorbell sound output device 406, and a doorbell sound output device controller 408 external to the doorbell switch 404. The doorbell sound output device 406 is, for example, a mechanical doorbell sound output device or an electronic doorbell sound output device. A primary winding 410 of the transformer 402 is electrically coupled to an AC electrical power source (not shown), and a secondary winding 412 of the transformer 402 is electrically coupled to the doorbell switch 404 and the doorbell sound output device controller 408 via wiring 414. Each of the doorbell switch 404 and the doorbell sound output device controller 408 are electrically coupled in parallel with the second winding 412 via the wiring 414.

The doorbell switch 404 includes a user input device 416, activation circuitry 418, and power supply circuitry 420. The user input device 416 is configured to receive a user command to activate the doorbell sound output device 406. In certain embodiments, the user input device 416 is a touch-sensitive input device, such as a push-button switch or a capacitive sensing device, which receives a user command to activate the doorbell sound output device 406 by a user touching the user input device. Additionally, or alternatively, in some embodiments, the user input device 416 is configured to receive a user command to activate the doorbell sound output device 406 by detecting presence of a user in the vicinity of the doorbell switch 404, such as from image capture of the user, motion of the user, and/or infrared energy emitting by the user.

The activation circuitry 418 is configured to generate an activation signal in response to the user input device 416 receiving the user command to activate the doorbell sound output device 406. In particular embodiments, the activation circuitry 418 is configured to transmit the activation signal to the doorbell sound output device controller 408 via the wiring 414 electrically coupling the doorbell switch 404 to the doorbell sound output device controller 408, such as discussed below with respect to FIGS. 5 and 7. In some other embodiments, the activation circuitry 418 is configured to transmit the activation signal to the doorbell sound output device controller 408 using another technique, such as using radio frequency transmission or optical transmission.

The power supply circuitry 420 is configured to receive input electrical power from the transformer 402 via the wiring 414 electrically coupling the doorbell switch 404 to the doorbell sound output device controller 408 and the transformer 402. Additionally, the power supply circuitry 420 is configured to electrically power the doorbell switch 404. In some embodiments, the power supply circuitry 420 includes a switching power converter and/or a linear regulator, while in some other embodiments, the power supply circuitry 420 rectifies and filters AC voltage from secondary winding 412 to provide bulk power to doorbell switch 404.

Figure 22:
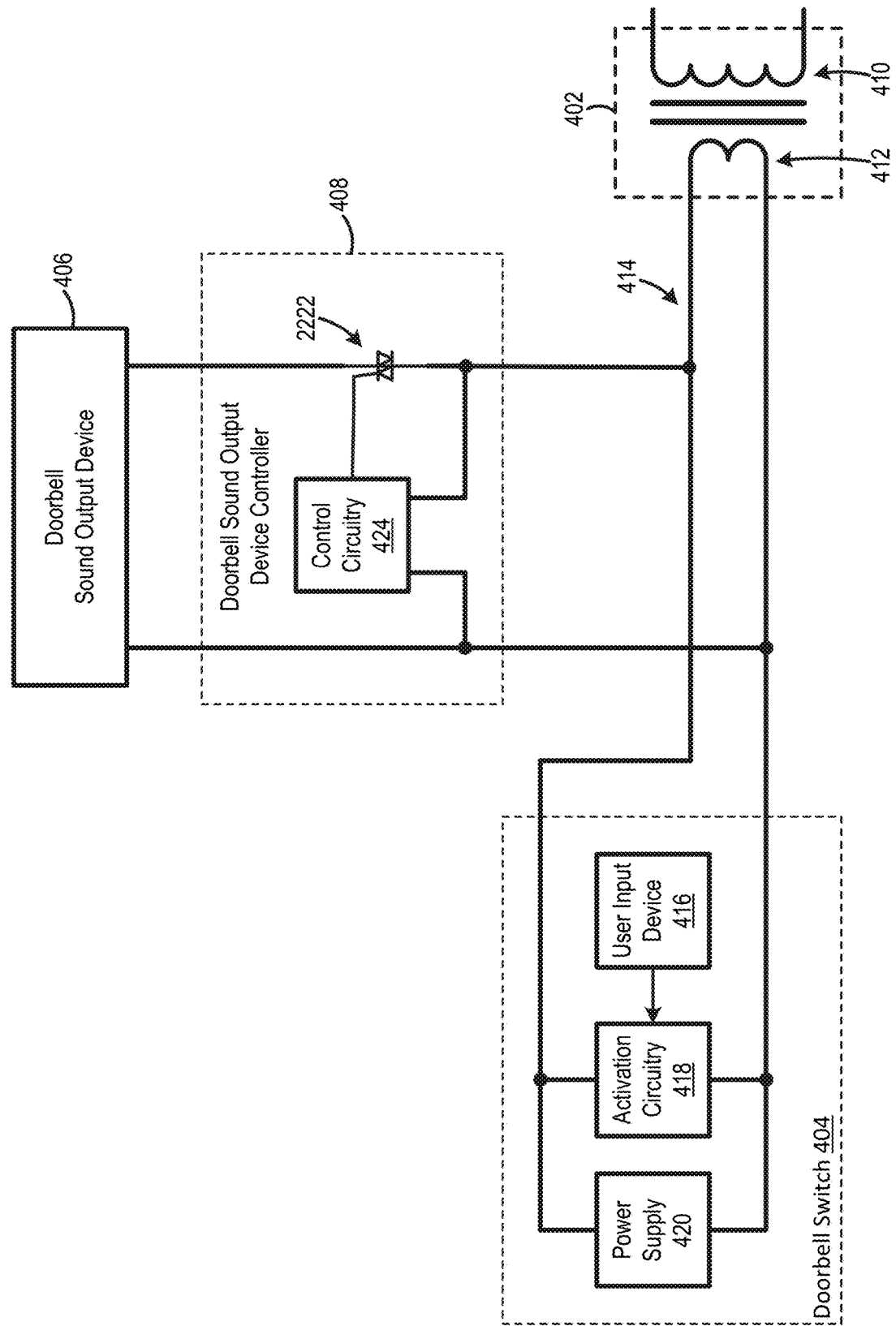
FIG. 22 is a schematic diagram illustrating a doorbell system including a doorbell sound output device controller with a switching device including a triac, according to an embodiment.

The doorbell sound output device controller 408 includes a switching device 422 and control circuitry 424. The switching device 422 is configured to control flow of electrical power from the transformer 402 to the doorbell sound output device 406. The switching device 422 includes, for example, a triac, one or more transistors, or an electromechanical relay. For example, FIG. 22 illustrates an embodiment of the doorbell system 400 where the switching device 422 includes a triac 2222. In particular embodiments, the switching device 422 includes two metal oxide semiconductor field effect transistors (MOSFETs) electrically coupled in series such that the respective body diodes of the MOSFETs have opposing orientations, to prevent both body diodes from being simultaneously forward-biased. The control circuitry 424 is configured to receive the activation signal from the doorbell switch 404, and control the switching device 422 to enable flow of electrical current from the transformer 402 to the doorbell sound output device 406 in response to receiving the activation signal from the doorbell switch 404. Thus, the doorbell sound output device 406 emits at least one tone in response to the user input device 416 receiving the user command to activate the doorbell sound output device 406.

Figure 5:
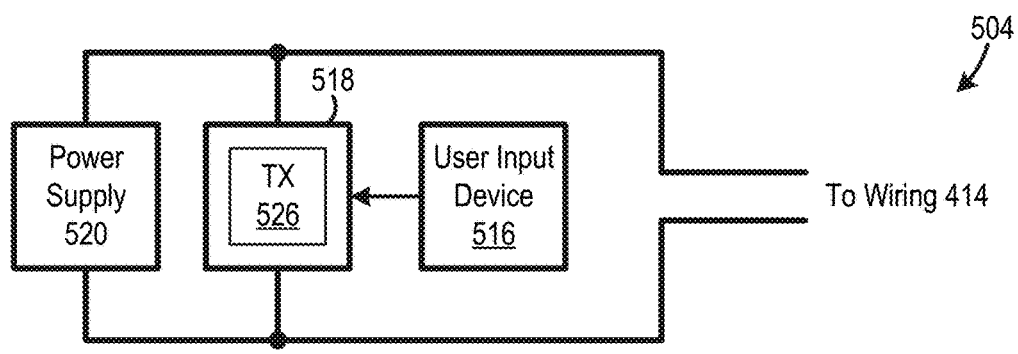
FIG. 5 is a schematic diagram illustrating a doorbell switch including a transmitter, according to an embodiment.

FIG. 5 illustrates a doorbell switch 504, which is one embodiment of the doorbell switch 404. The doorbell switch 504 includes a user input device 516, activation circuitry 518, and power supply circuitry 520, which are embodiments of the user input device 416, the activation circuitry 418, and the power supply circuitry 420, respectively. The activation circuitry 518 includes a transmitter 526 configured to generate an activation signal in the form of a tone on the wiring 414 electrically coupling the doorbell switch to the doorbell sound output device controller, to transmit the activation signal to the doorbell sound output device controller. In some embodiments, the activation circuitry 518 generates the tone on the wiring 414 as a differential signal, to promote distinguishing the tone from spurious noise. In some embodiments, the tone generated by the transmitter 526 is a simple tone, e.g., a tone composed of one or more signals of constant frequency and magnitude. In some other embodiments, the tone generated by the transmitter 526 is a modulated tone, such as to facilitate distinguishing the tone from spurious noise and/or to enable the tone to carry information to the doorbell sound output device controller.

The activation circuitry 518 and the power supply circuitry 520 are electrically coupled in parallel with the wiring 414, such that operation of the activation circuitry 518 does not interfere with operation of the power supply circuitry 520. Thus, the power supply circuitry 520 is capable of powering the doorbell switch 504 even when the activation circuitry 518 is transmitting an activation signal to the doorbell sound output device controller. Consequently, the doorbell switch 504 can continuously operate without an energy storage device.

Figure 6:
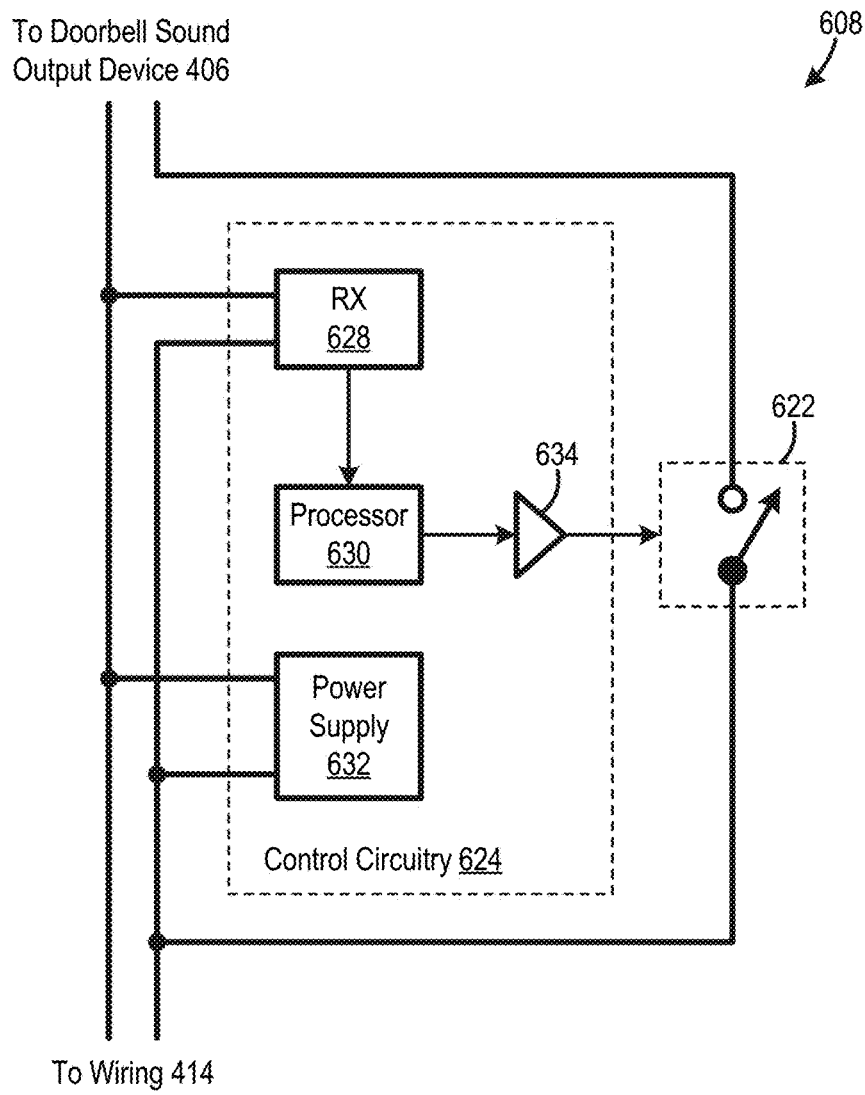
FIG. 6 is a schematic diagram illustrating a doorbell sound output device controller including a receiver, according to an embodiment.

FIG. 6 illustrates a doorbell sound output device controller 608, which is one embodiment of doorbell sound output device controller 408. The doorbell sound output device controller 608 is capable of use with the doorbell switch 504 of FIG. 5. The doorbell sound output device controller 608 includes a switching device 622 and control circuitry 624, which are embodiments of the switching device 422 and the control circuitry 424, respectively. Control circuitry 624 includes a receiver 628, a processor 630, a power supply 632, and driver circuitry 634. The receiver 628 is configured to receive the tone generated the doorbell switch 504 via the wiring 414 electrically coupling the doorbell switch 504 to the doorbell sound output device controller 608. In some embodiments, the processor 630 may comprise a microprocessor, or another type of processor, such as an ASIC (application-specific integrated circuit). In some embodiments, the receiver 628 includes a phase-locked loop configured to detect a signal having the frequency of the tone generated by the doorbell switch 504. Additionally, in some embodiments, the receiver 628 includes a bandpass filter and a peak detector to facilitate detecting the tone generated by the doorbell switch 504.

The processor 630 receives detected signals from the receiver 628, and the processor 630 filters the tone generated by the doorbell switch 504 from other signals received by the control circuitry 624. Thus, the processor 630 promotes immunity of the control circuitry 624 to spurious noise. In some embodiments, the processor 630 is further configured to amplify and digitize signals detected by the receiver 628.

The driver circuitry 634 is configured to electrically interface the switching device 622 with the processor 630. For example, in embodiments where the switching device 622 includes one or more MOSFETs, the driver circuitry 634 is configured to drive the gates of the one or more MOSFETs, to switch the MOSFETs between their conductive and non-conductive states. In particular embodiments, the driver circuitry 634 is configured provide galvanic isolation between the control circuitry 634 and the switching device 622, such as via optical or magnetic coupling. The processor 630 controls the driver circuitry 634 to cause the switching device 622 to operate in its conductive state in response to the processor 630 detecting the tone generated by the doorbell switch 504, thereby causing the doorbell sound output device 406 to emit at least one tone.

In some embodiments, the processor 630 is configured to cause the switching device 622 to operate in its conductive state for a fixed duration in response to the control circuitry 624 receiving the tone from the doorbell switch 504. In some other embodiments, the processor 630 is configured to enable adjustment of a duration that the switching device 622 operates in its conductive state in response to the control circuitry 624 receiving the tone from the doorbell switch 504. For example, in a particular embodiment, the processor 630 is configured to receive a configuration command, such as from the doorbell switch 504 or from one or more configuration switches (not shown) in the doorbell sound output device controller 608, to enable adjustment of the duration that the switching device 622 operates in its conductive state in response to the control circuitry 624 receiving the tone from the doorbell switch 504.

The power supply 632 receives electrical power from the transformer 402 via wiring 414, and the power supply 632 is configured to provide electrical power to the control circuitry 624. In some embodiments, the power supply 632 includes a switching power converter and/or a linear regulator, while in some other embodiments, the power supply 632 rectifies and filters AC voltage from secondary winding 412.

Figure 23:
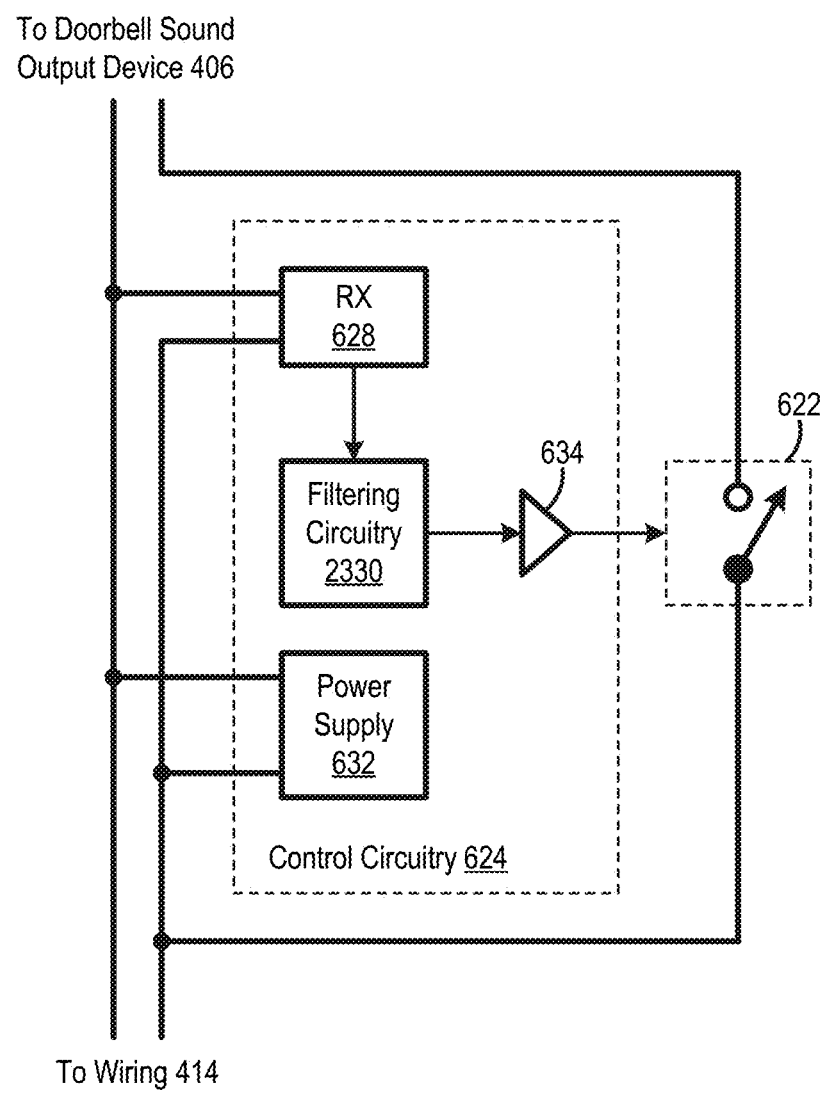
FIG. 23 is a schematic diagram illustrating a doorbell sound output device controller including filtering circuitry, according to an embodiment.

The control circuitry 624 could be modified without departing from the scope of the present embodiments. For example, in some alternate embodiments, the processor 630 is replaced with other analog and/or digital circuitry configured to act as filtering circuitry. FIG. 23 illustrates a doorbell sound output device controller similar to the doorbell sound output device controller 608 but where the processor 630 is replaced with filtering circuitry 2330. As another example, in some other alternate embodiments, the processor 630 is omitted and the receiver 628 is directly coupled to the driver circuitry 634.

Figure 7:
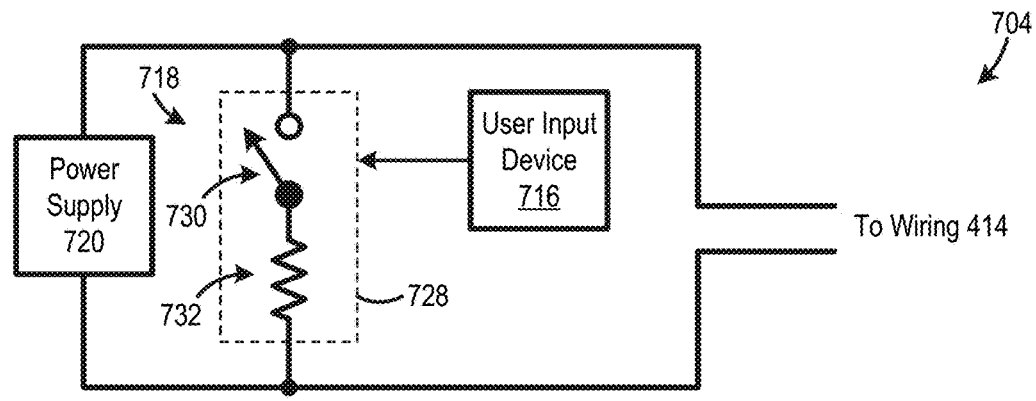
FIG. 7 is a schematic diagram illustrating a doorbell switch including perturbation circuitry, according to an embodiment.

FIG. 7 illustrates a doorbell switch 704, which is another embodiment of the doorbell switch 404. The doorbell switch 704 includes a user input device 716, activation circuitry 718, and power supply circuitry 720, which are embodiments of the user input device 416, the activation circuitry 418, and the power supply circuitry 420, respectively. The activation circuitry 718 includes perturbation circuitry 728 configured to generate an activation signal on the wiring 414 electrically coupling the doorbell switch to the doorbell sound output device controller by changing electrical current flowing through the wiring, in response to the user input device 716 receiving a command to activate the doorbell sound output device 406.

The perturbation circuitry 728 includes a normally-open perturbation switching device 730 and an impedance device 732 electrically coupled in series across the wiring 414 electrically coupling the doorbell switch 704 to the doorbell sound output device controller. The impedance value of the impedance device 732 is chosen to be sufficiently low to enable detection of the perturbation switching device 730 being closed through an increase in current flowing between the doorbell switch 704 and a doorbell sound output device controller. However, the impedance value of the impedance device 732 should not be so low as to dissipate excessive power when the perturbation switching device 730 is closed. Although the impedance device 732 is illustrated as a single resistor, the impedance device 732 can take other forms, such as a network of resistors and/or one or more complex impedance devices without departing from the scope of the present embodiments. The perturbation circuitry 728 is configured to close the perturbation switching device 730 in response to the user input device 716 receiving a command to activate the doorbell sound output device 406, thereby changing (increasing) the magnitude of the current flowing through the wiring 414 between the doorbell switch 704 the doorbell sound output device controller.

The activation circuitry 718 and the power supply 720 are electrically coupled in parallel with the wiring 414, and an impedance value of the impedance device 732 is sufficiently high such that closing of the perturbation switching device 730 does not degrade operation of the power supply circuitry 720. Consequently, operation of the activation circuitry 718 does not interfere with operation of the power supply circuitry 720, and the power supply circuitry 720 is capable of powering the doorbell switch 704 even while the activation circuitry 718 is transmitting an activation signal to a doorbell sound output device controller. Consequently, the doorbell switch 704 can continuously operate without an energy storage device.

Figure 8:
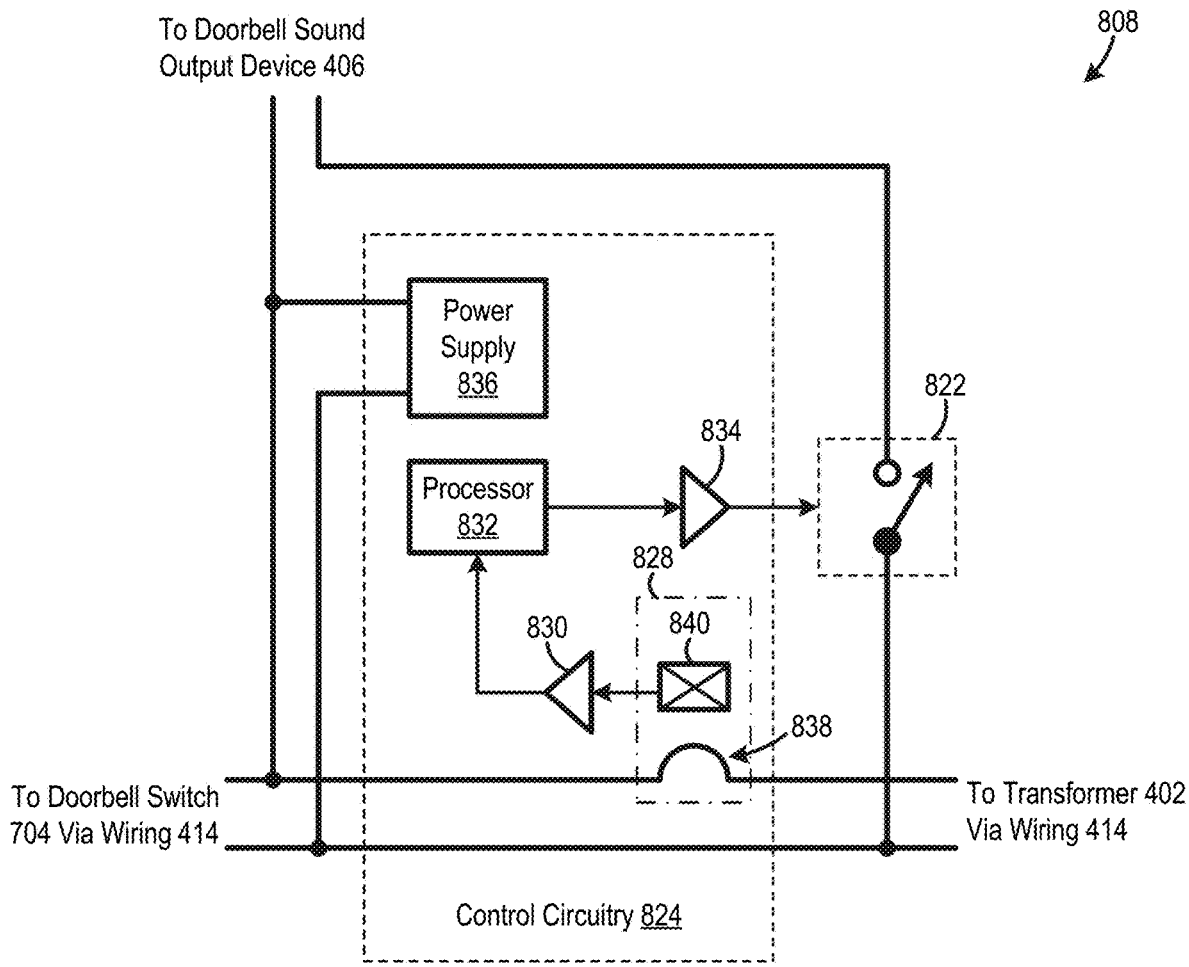
FIG. 8 is a schematic diagram illustrating a doorbell sound output device controller including current sense circuitry, according to an embodiment.

FIG. 8 illustrates a doorbell sound output device controller 808, which is another embodiment of the doorbell sound output device controller 408. The doorbell sound output device controller 808 is capable of use with the doorbell switch 704 of FIG. 7. The doorbell sound output device controller 808 includes a switching device 822 and control circuitry 824, which are embodiments of the switching device 422 and the control circuitry 424, respectively. The control circuitry 824 includes current sense circuitry 828, a conditioner 830, a processor 832, driver circuitry 834, and a power supply 836. In some embodiments, the processor 832 may comprise a microprocessor, or another type of processor, such as an ASIC (application-specific integrated circuit).

The current sensing circuitry 828 is configured the receive the activation signal from the doorbell switch 704 via a change in electrical current flowing between the doorbell sound output device control 808 and the doorbell switch 704. In the illustrated embodiment, current sense circuitry 828 includes an electrical conductor 838 and a Hall effect sensor 840. The electrical conductor 838 is configured to be electrically coupled to the doorbell switch 704 such that electrical current flowing between the doorbell switch 704 and the doorbell sound output device controller 808 flows through the electrical conductor 838. Therefore, electrical current flowing through the electrical conductor 838 represents the electrical current flowing between the doorbell switch 704 and the doorbell sound output device controller 808. In certain embodiments, the electrical conductor 838 forms a small number of turns, such as only a single turn, to minimize length and associated resistance of the electrical conductor 838. The Hall effect sensor 840 is configured to sense a magnetic field generated by electrical current flowing through the electrical conductor 838 and generate a correspond signal.

The use of the electrical conductor 838 and the Hall effect sensor 840 to detect the activation signal generated by the doorbell switch 704 has advantages. For example, the electrical conductor 838 can be embodied as a single loop of copper wire or metal film integrated within the package of an integrated circuit (IC), to promote low cost, low voltage drop across the current sensing circuitry 828, and/or ease of manufacturing the current sensing circuitry. Additionally, the magnetic coupling between electrical conductor 838 and the Hall effect sensor 840 may provide galvanic isolation between DC-powered components of the control circuitry 824 and AC powered circuitry.

The conditioner 830 conditions the signal generated by the Hall effect sensor 840 to a form that is compatible with the processor 832. For example, in some embodiments, the conditioner 830 sufficiently amplifies the signal generated by the Hall effect sensor 840 so that the signal is detectable by the processor 832. In some embodiments, the processor 832 is further configured to amplify and digitize signals detected by the conditioner 830. The processor 832 is configured to detect the change in electrical current flowing between the doorbell sound output device controller 808 and the doorbell switch 704, which represents the activation signal, from the conditioned signal via generated by the conditioner 830.

Figure 9:
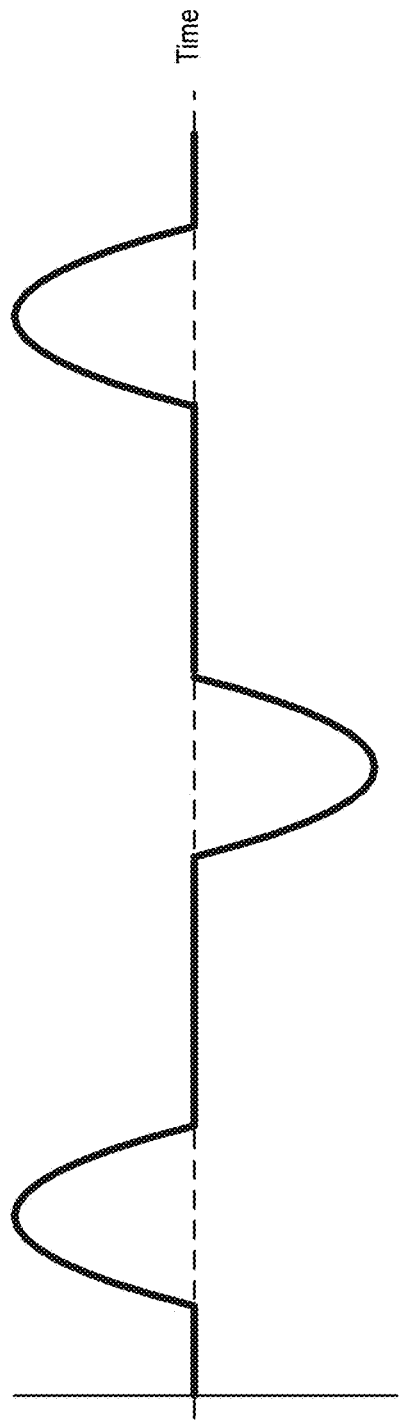
FIG. 9 is an example graph of magnitude of current through an electrical conductor of the FIG. 8 doorbell sound output device controller when a perturbation switching device is open, according to an embodiment.
Figure 10:
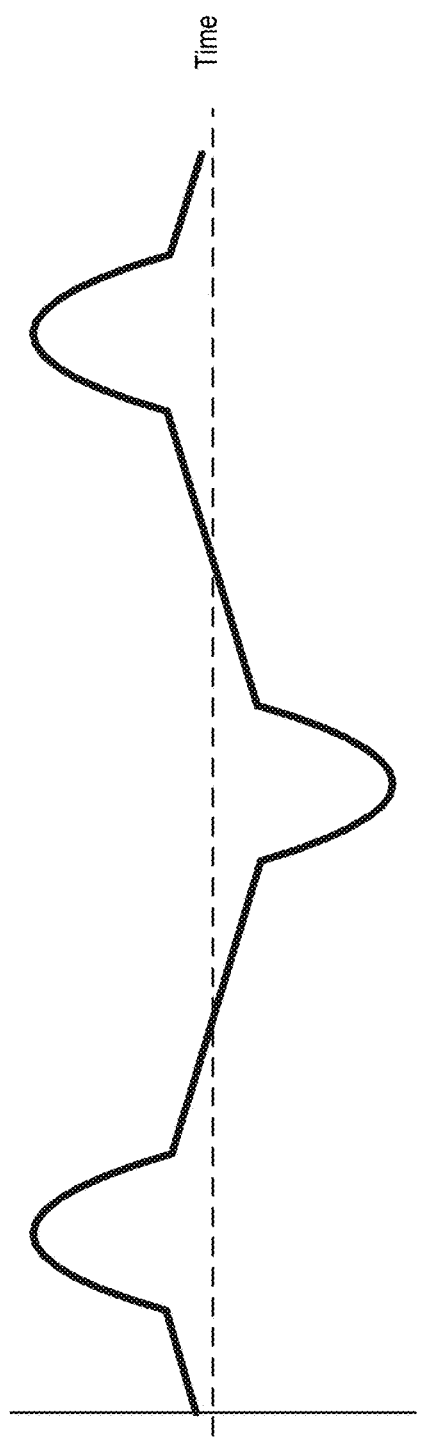
FIG. 10 is an example graph of magnitude of current through an electrical conductor of the FIG. 8 doorbell sound output device controller when a perturbation switching device is closed, according to an embodiment.

For instance, in some embodiments, the processor 832 is configured to detect the activation signal in response to a change in amount of time that magnitude of the electrical current flowing through the electrical conductor 838 is zero, which is equivalent to a change in amount of time that the magnitude of the electrical current flowing between the doorbell sound output device controller 808 and the doorbell switch 704 is zero. To help appreciate how magnitude of electrical current can be changed by the perturbation circuitry 728, consider the examples of FIGS. 9 and 10. FIG. 9 is an example graph of magnitude of current through the electrical conductor 838 versus time when the switching device 730 is open, and FIG. 10 is an example graph of current through the electrical conductor 838 versus time when the switching device 730 is closed. As illustrated in FIG. 9, magnitude of current through the electrical conductor 838 is zero more than 50% of the time when the switching device 730 is open, e.g., when the activation circuitry 718 is not generating an activation signal. In contrast, when the switching device 730 is closed, e.g., when the activation circuitry 718 is generating an activation signal, magnitude of current through the electrical conductor 838 is zero only twice per cycle of AC voltage across the wiring 414. The processor 832 detects such decrease in amount of time that magnitude of current through the electrical conductor 838 is zero as an activation signal from the doorbell switch 704.

The small magnitude of current through the impedance device 732 relative to the scale of the FIG. 10 graph causes portions of the FIG. 10 graph to appear linear. Such portions of the graph are actually sinusoidal, but such sinusoidal characteristic is not perceptible in the FIG. 10 graph.

The driver circuitry 834 is configured to interface the switching device 822 with the processor 832 in a manner analogous to that of the driver circuitry 634 of FIG. 6. The processor 832 controls the driver circuitry 834 to cause the switching device 822 to operate in its conductive state in response to the processor 832 detecting the activation signal generated by the doorbell switch 704 from a change in electrical current flowing through the electrical conductor 838, thereby causing the doorbell sound output device 406 to emit at least one tone.

In some embodiments, the processor 832 is configured to cause the switching device 822 to operate in its conductive state for a fixed duration in response to the control circuitry 824 receiving an activation signal from doorbell switch 704. In some other embodiments, the processor 832 is configured to enable adjustment of a duration that the switching device 822 operates in its conductive state in response to the control circuitry 824 receiving the activation signal from the doorbell switch 704. For example, in a particular embodiment, the processor 832 is configured to receive a configuration command, such as from the doorbell switch 704 or from one or more configuration switches (not shown) in the doorbell sound output device controller 808, to enable adjustment of the duration that the switching device 822 operates in its conductive state in response to the control circuitry 824 receiving the activation signal from the doorbell switch 704.

The power supply 836 receives electrical power from the transformer 402 via the wiring 414, and the power supply 836 is configured to provide electrical power to the control circuitry 824. In some embodiments, the power supply 832 includes a switching power converter and/or a linear regulator, while in some other embodiments, the power supply 832 rectifies and filters AC voltage from the secondary winding 412.

The control circuitry 824 could be modified without departing from the scope of the present embodiments. For example, in some alternate embodiments, the processor 832 is replaced with other analog and/or digital circuitry configured to act as filtering circuitry. As another example, in some other alternate embodiments, the processor 832 is omitted and the conditioner 830 is directly coupled to the driver circuitry 834. As another example, in certain alternate embodiments, the current sense circuitry 828 is implemented in a different manner than that illustrated in FIG. 8, such as by use of a current sense resistor in place of the electrical conductor 838 and the Hall effect sensor 840.

Figure 11:
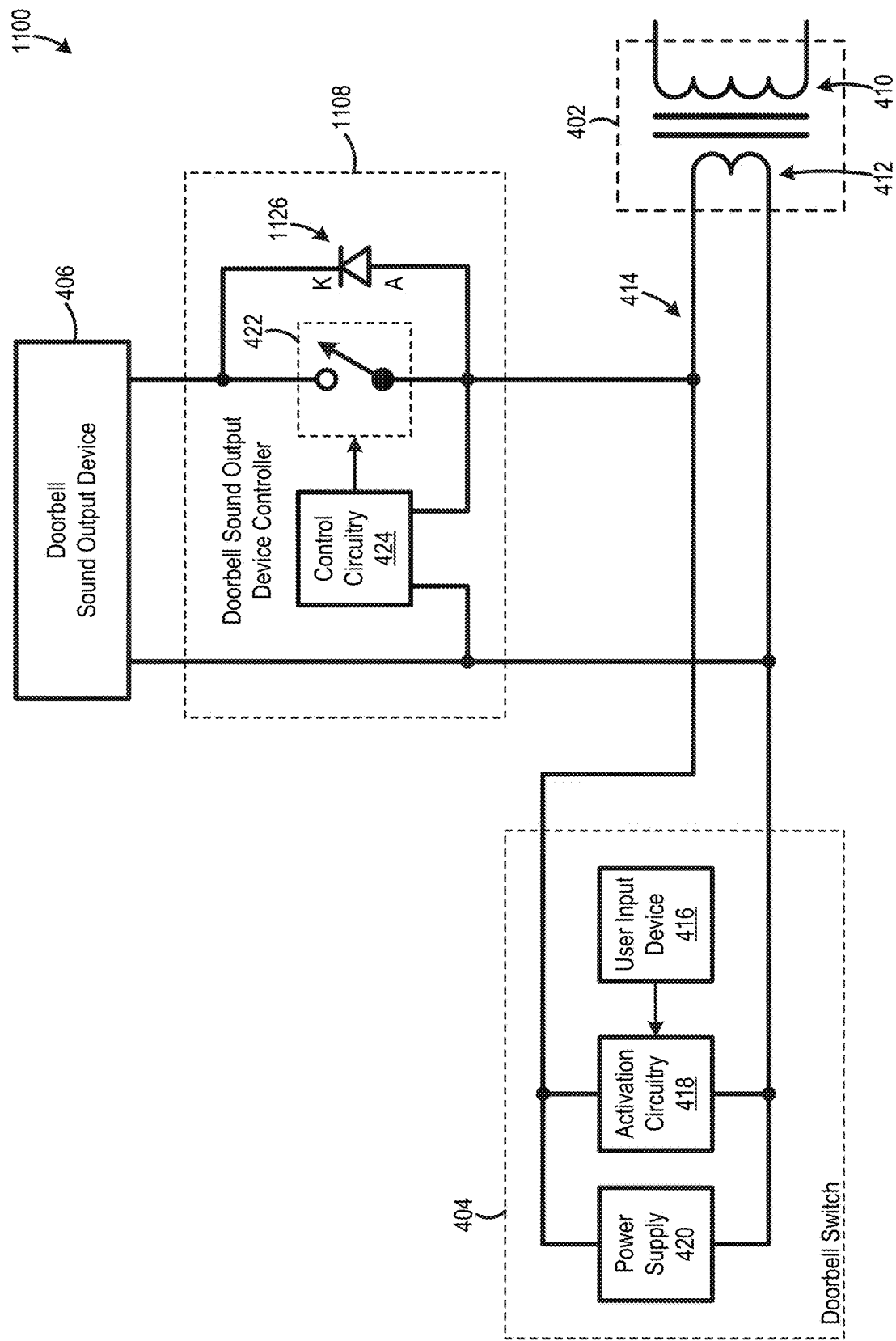
FIG. 11 is a schematic diagram illustrating a doorbell system including a doorbell sound output device controller with a diode device electrically coupled in parallel with a switching device, according to an embodiment.

The doorbell sound output device controllers herein could be configured to support an electronic doorbell sound output device. For example, FIG. 11 illustrates a doorbell system 1100, which is similar to the doorbell system 400 of FIG. 4, but where the doorbell sound output device controller 408 is replaced with a doorbell sound output device controller 1108. The doorbell sound output device controller 1108 is similar to the doorbell sound output device controller 408, but further includes a diode device 1126 electrically coupled in parallel with the switching device 422. The diode device 1126 provides a path for DC electrical current between the doorbell sound output device controller 1108 and the doorbell sound output device 406, such as in cases where the doorbell sound output device 406 is an electronic doorbell sound output device. The polarity of the diode device 1126, e.g., the locations of its anode (A) and cathode (K) with respect to other components of the doorbell sound output device controller 1108, could be reversed without departing from the scope of the present embodiments.

In some embodiments, the diode device 1126 is implemented by a single semiconductor diode, such as illustrated in FIG. 11. In some other embodiments, the diode device 1126 is implemented by multiple semiconductor diodes electrically coupled in series, such as to achieve a high breakdown voltage rating. In yet some other embodiments, the diode device 1126 is implemented by one or more transistors, or by body diodes of one or more transistors.

Figure 12:
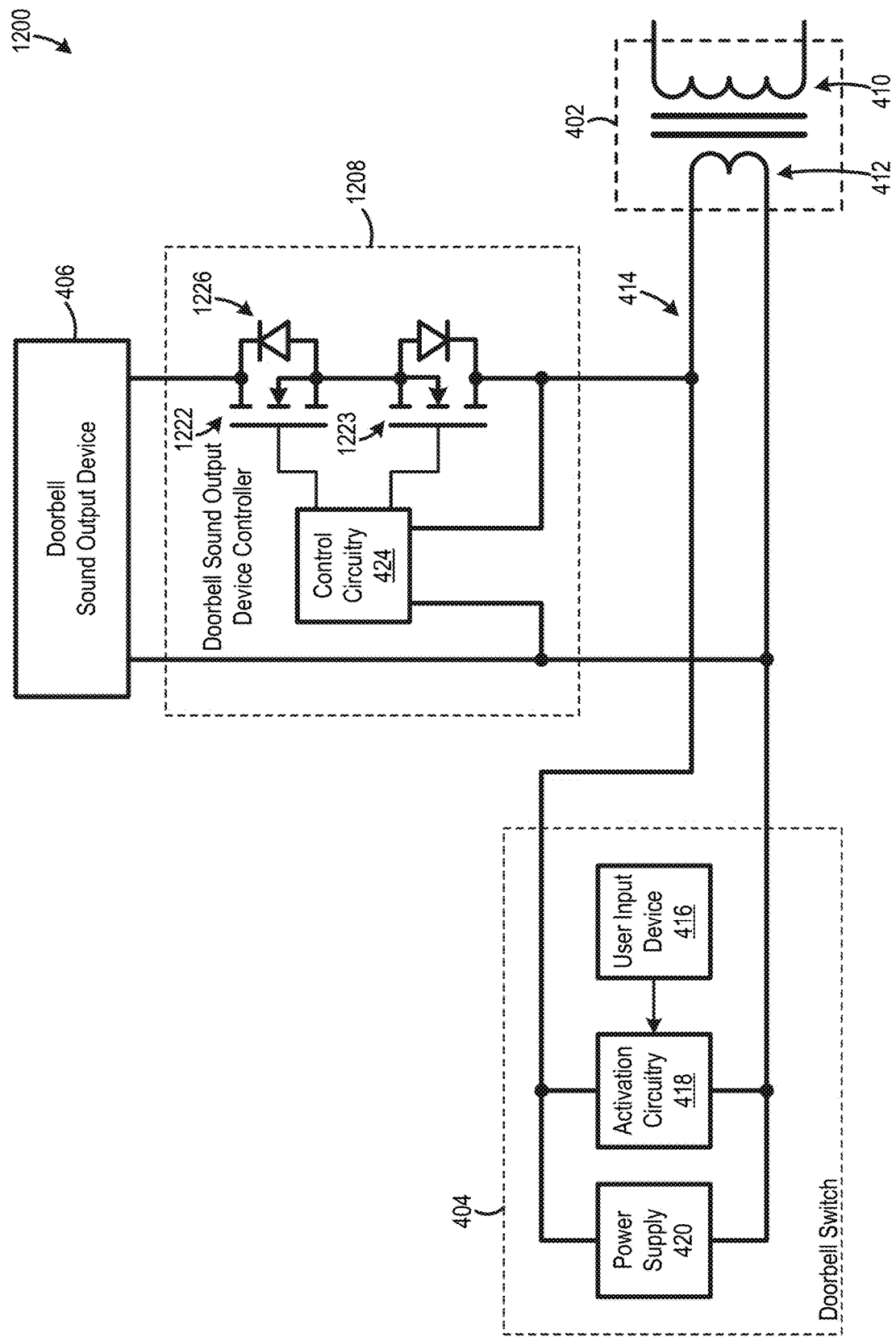
FIG. 12 is a schematic diagram illustrating a doorbell system where a doorbell sound output device controller includes a switching device implemented by two metal oxide semiconductor field effect transistors, according to an embodiment.

For example, FIG. 12 illustrates a doorbell system 1200, which is an embodiment of the doorbell system 1100 where the doorbell sound output device controller 1108 is implemented as a doorbell sound output device controller 1208. The switching device 422 of the doorbell sound output device controller 1108 is implemented by two n-channel, enhancement MOSFETs 1222 and 1223 electrically coupled in series with opposing orientations, in the doorbell sound output device controller 1208. The control circuitry 424 drives the gates of the MOSFETs 1222 and 1223 to switch the MOSFETs between their respective conductive and non-conductive states to control flow of electrical current between the doorbell sound output device controller 1208 and the doorbell sound output device 406. The control circuitry 424 is further configured to receive a configuration command, such as from the doorbell switch 404 or from configuration switches (not shown) in the doorbell sound output device controller 1208, to configure the doorbell sound output device controller 1208 for use with an electronic doorbell sound output device. In particular, the control circuitry 424 causes the MOSFET 1223 to continuously operate in its conductive state in response to the configuration command, such that a body diode 1226 of the MOSFET 1222 provides a path for direct current between the doorbell sound output device controller 1208 and the doorbell sound output device 406.

The configurations of the transistors in doorbell sound output device controller 1208 could be varied with departing from the scope of the present embodiments. For example, the MOSFETs 1222 and 1223 could be replaced with p-channel MOSFETs with appropriate changes to the control circuitry 424.

Figure 13:
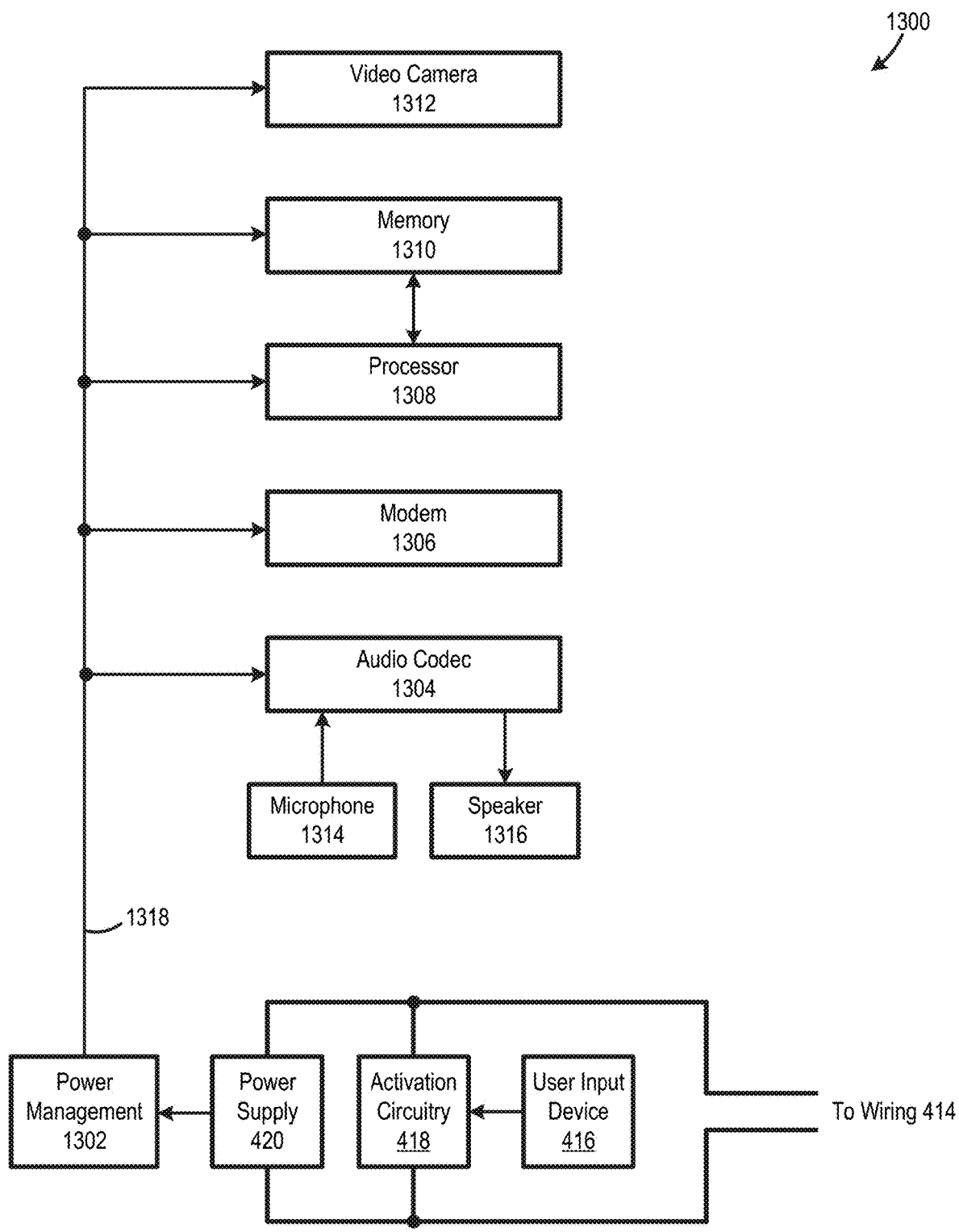
FIG. 13 is a schematic diagram illustrating a doorbell switch configured as a video doorbell, according to an embodiment.

Although the doorbell switches 404, 504, and 704 are illustrated as including only a user input device, activation circuitry, and power supply circuitry for illustrative simplicity, any of these doorbell switches could include additional components without departing from the scope of the present embodiments. For example, FIG. 13 illustrates a doorbell switch 1300, which is an embodiment of the doorbell switch 404 configured as a video doorbell. The doorbell switch 1300 represents an audio/video (A/V) recording and communication device (also referred to as a security device). The doorbell switch 1300 includes power management circuitry 1302, an audio coder-decoder (codec) 1304, a modem 1306, a processor 1308, a memory 1310 communicatively coupled to the processor 1308, a video camera 1312, a microphone 1314, and a speaker 1316, as well as an instance of the user input device 416, the activation circuitry 418, and the power supply circuitry 420. The power management circuitry 1302 receives bulk power from the power supply circuitry 420 and conditions the bulk power for use by the doorbell switch 1300. For example, in some embodiments, the power management circuitry 1302 regulates bulk power from the power supply circuitry 420. Electrical power from the power management circuitry 1302 is distributed to other components of the doorbell switch 1300 via an electrical bus 1318. The power management circuitry 1302 may be omitted in cases where bulk power from the power supply circuitry 420 is sufficiently regulated for use within the doorbell switch 1300.

The modem 1306 is configured to enable the doorbell switch 1300 to communicate with an external system. For example, in some embodiments, the modem 1306 is a wireless modem, such as for use with a WiFi network. As another example, in some other embodiments, the modem 1306 is configured for use with an optical network or a wired network. Communications via the modem 1306 may also include links to any of a variety of wireless networks, including WAP (Wireless Application Protocol), GPRS (General Packet Radio Service), GSM (Global System for Mobile Communication), LTE, VoLTE, LoRaWAN, LPWAN, RPMA, LTE Cat-"X" (e.g., LTE Cat 1, LTE Cat 0, LTE CatM1, LTE Cat NB1), CDMA (Code Division Multiple Access), TDMA (Time Division Multiple Access), FDMA (Frequency Division Multiple Access), and/or OFDMA (Orthogonal Frequency Division Multiple Access) cellular phone networks, GPS, CDPD (cellular digital packet data), RIM (Research in Motion, Limited) duplex paging network, Bluetooth radio, or an IEEE 802.11-based radio frequency network. The modem 1306 may further include or interface with any one or more of the following: RS-232 serial connection, IEEE-1394 (Firewire) connection, Fibre Channel connection, IrDA (infrared) port, SCSI (Small Computer Systems Interface) connection, USB (Universal Serial Bus) connection, or other wired or wireless, digital or analog, interface or connection, mesh or Digi® networking.

The video camera 1312 is configured to generate video image data representing a scene proximate to the doorbell switch 1300. In particular embodiments, the video camera 1312 includes a complementary metal oxide semiconductor (CMOS) image sensor and supporting circuitry. The video camera 1312 in some embodiments may include an infrared light source and a selectively-activated infrared filter, to facilitate generating video image data in both light and dark ambient conditions.

The audio codec 1304 is configured to interface the microphone 1312 and the speaker 1314, which are each analog devices, with digital circuitry in the doorbell switch 1300, such with the processor 1308. Accordingly, the audio codec 1304 is configured to convert data between digital form and analog form, and vice versa. The microphone 1314 is configured to generate sound data representing sound proximate to the doorbell switch 1300, and the speaker 1316 is configured to generate sound data representing sound in response to a signal received by the doorbell switch 1300 from a device external to the doorbell switch 1300.

The processor 1308 is configured to execute instructions in the form of software and/or firmware stored in the memory 1310 to control operation of the doorbell switch 1300. For example, in some embodiments, the processor 1308 is configured to enable a remote user to view a scene proximate to the doorbell switch 1300 via the video camera 1312 and the modem 1306. As another example, in certain embodiments, the processor 1308 is configured to enable a remote user to listen to sound proximate to the doorbell switch 1300 via the microphone 1314, the audio code 1304, and the modem 1306. As yet another example, in particular embodiments, the processor 1308 is configured to enable a remote user to make an audio announcement at the doorbell switch 1300 via the speaker 1316, the audio codec 1304, and the modem 1306.

Figure 14:
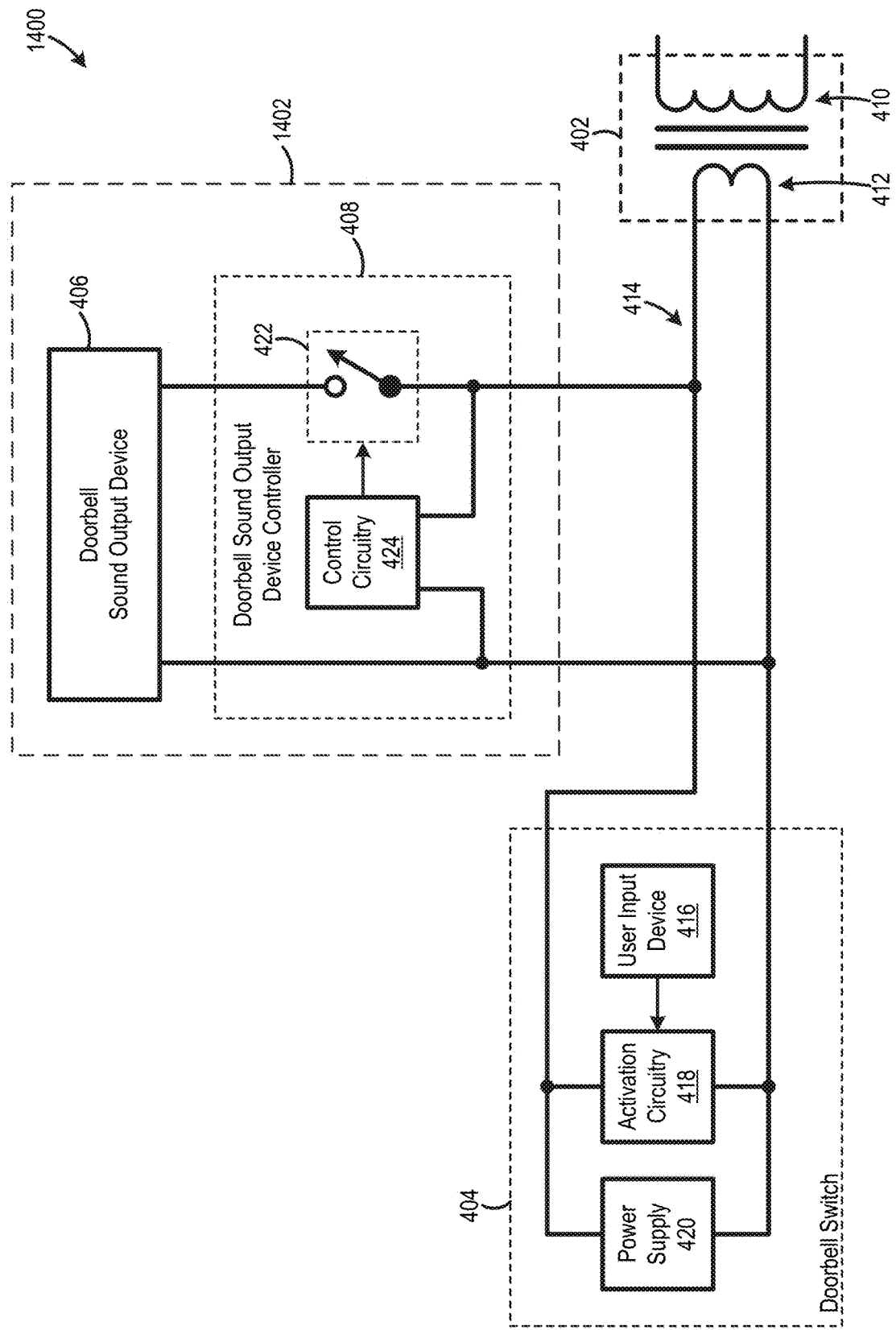
FIG. 14 is a schematic diagram illustrating a doorbell system where a doorbell sound output device and a doorbell sound output device controller are integrated in a common package, according to an embodiment.
Figure 15:
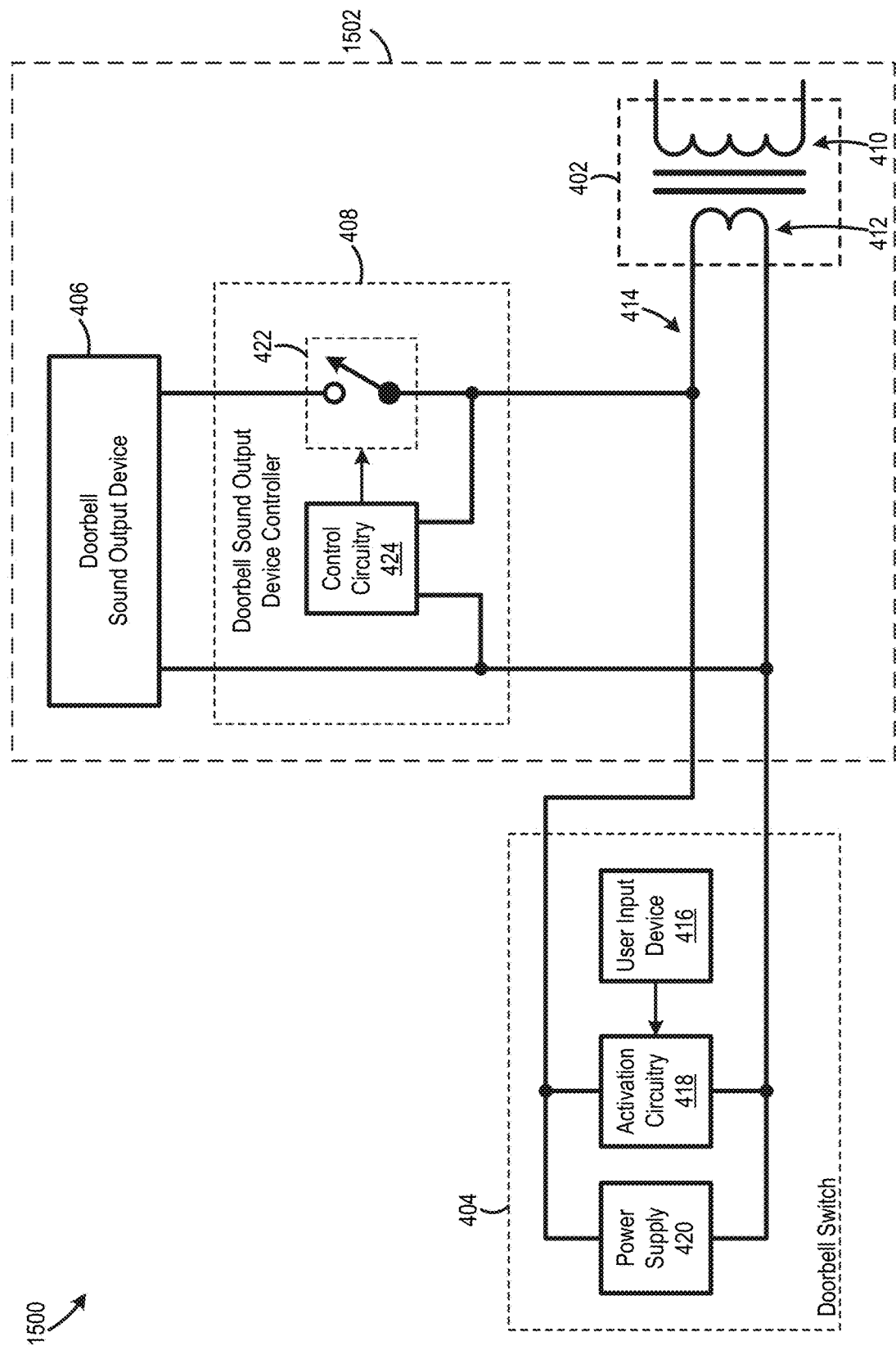
FIG. 15 is a schematic diagram illustrating a doorbell system where a doorbell sound output device, a doorbell sound output device controller, and a transformer are integrated in a common package, according to an embodiment.

Any of the doorbell switches 404, 504, and 704 could be integrated with a doorbell sound output device without departing from the scope of the present embodiments. For example, FIG. 14 illustrates a doorbell system 1400, which is similar to the doorbell system 400 of FIG. 4, but where the doorbell sound output device 406 and the doorbell sound output device controller 408 are integrated in a common package 1402. Additionally, the transformer 402 could be co-packaged the doorbell sound output device and the doorbell sound output device controller. For example, FIG. 15 illustrates a doorbell system 1500, which is similar to the doorbell system 400 of FIG. 4, but where the doorbell sound output device 406, the doorbell sound output device controller 408, and the transformer 402 are integrated in a common package 1502.

Figure 16:
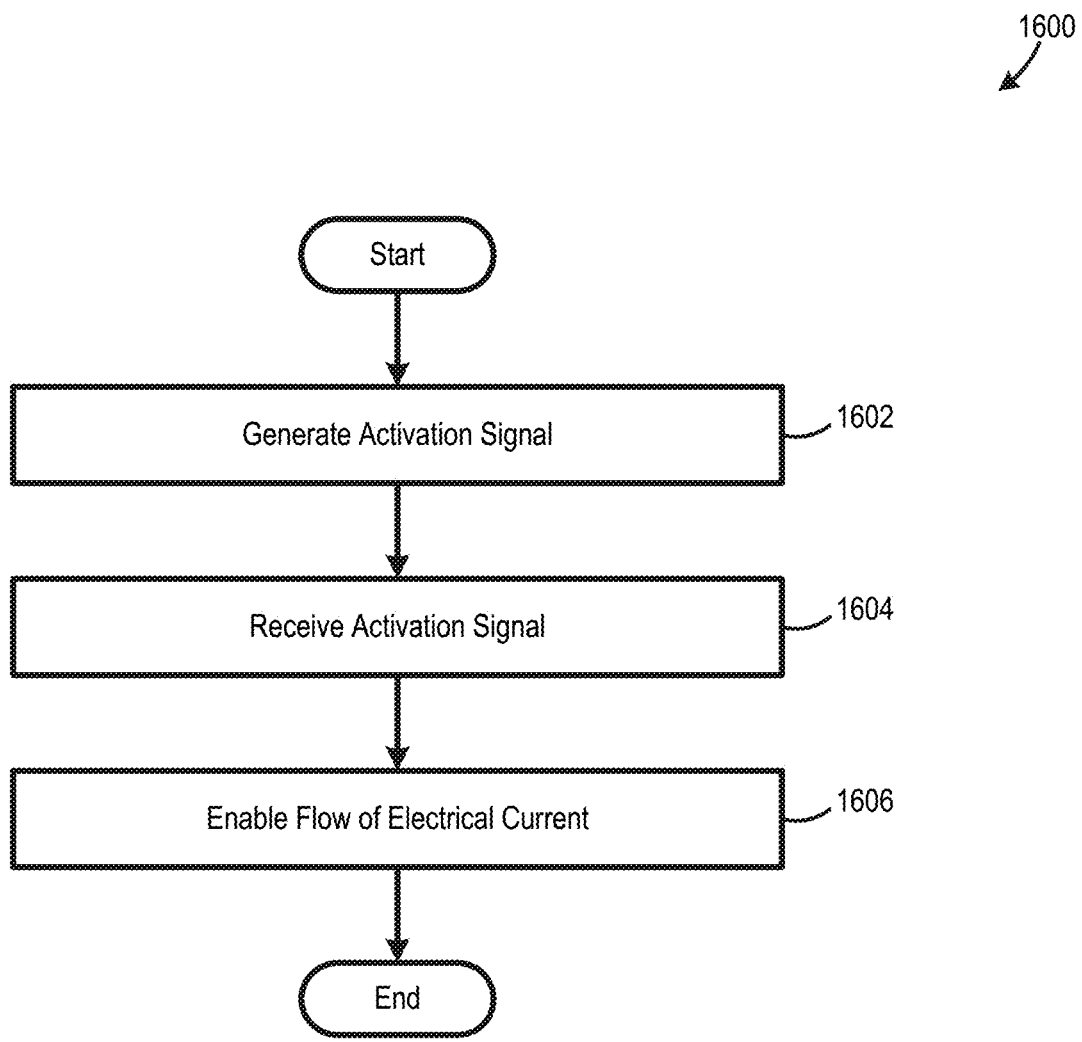
FIG. 16 is a flowchart illustrating a method for operating a doorbell sound output device, according to an embodiment.

FIG. 16 illustrates a method 1600 for operating a doorbell sound output device in accordance with various aspects of the present embodiments. At block 1602, an activation signal is generated at a doorbell switch in response a user command to activate the doorbell sound output device. In one example of block 1602, the transmitter 526 (FIG. 5) generates a tone on the wiring 414 in response to the user input device 516 receiving a user command to activate doorbell sound output device 406. In another example of block 1602, the perturbation switching device 730 (FIG. 7) closes in response to the user input device 716 receiving a user command to activate the doorbell sound output device 406.

At block 1604, the activation signal is received at a doorbell sound output device controller external to the doorbell switch. In one example of block 1604, the receiver 628 (FIG. 6) receives the activation signal via a tone from the doorbell switch 504. In another example of block 1604, the current sensing circuitry 828 (FIG. 8) receives the activation signal from the doorbell switch 704 via a change in electrical current flowing between the doorbell sound output device controller 808 and the doorbell switch 704.

At block 1606, flow of electrical current between the doorbell sound output device controller and the doorbell sound output device is enabled in response to receiving the activation signal at the doorbell sound output device controller. In one example of block 1606, the processor 630 (FIG. 6) controls the driver circuitry 634 to cause the switching device 622 to operate in its conductive state in response to the receiver 628 receiving an activation signal via a tone from the doorbell switch 504. As another example of block 1606, the processor 832 (FIG. 8) controls the driver circuitry 834 to cause the switching device 822 to operate in its conductive state in response to the current sensing circuitry 828 receiving the activation signal from the doorbell switch 704 via a change in electrical current flowing between the doorbell sound output device controller 808 and the doorbell switch 704.

A/V Recording and Communication Device

Figure 17:
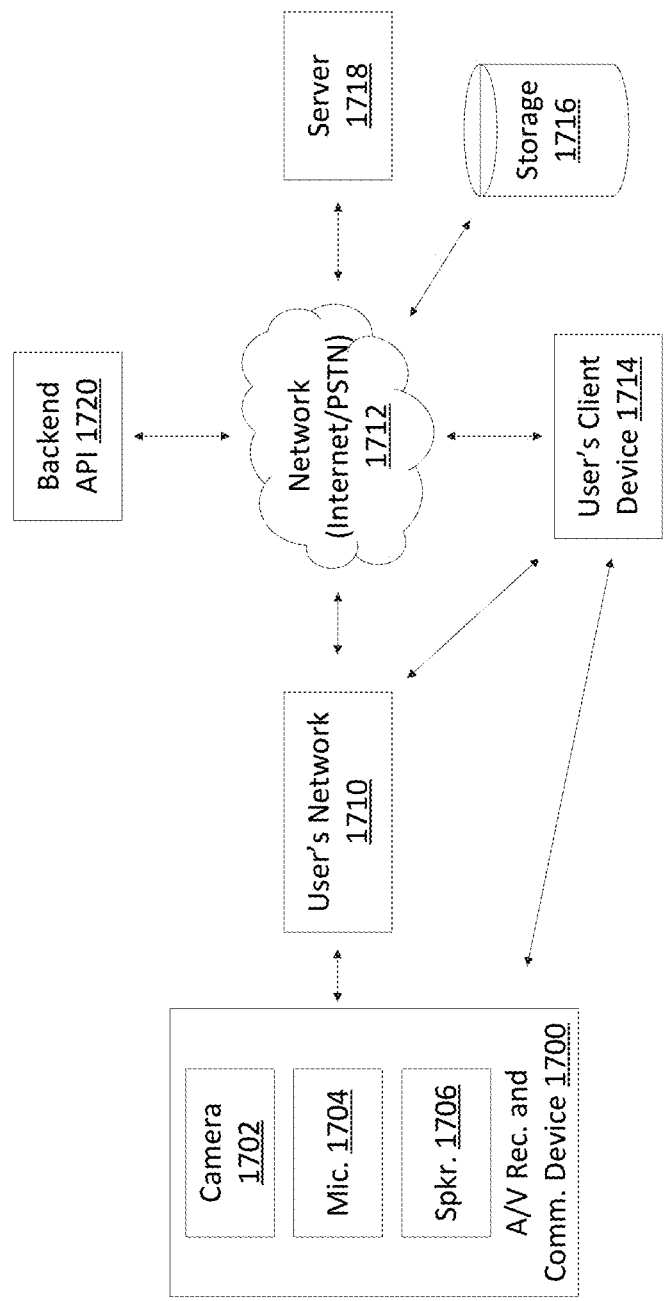
FIG. 17 is a functional block diagram illustrating a system for streaming and storing audio/video (A/V) content captured by a device, according to an embodiment.

With reference to FIG. 17, the present embodiments include an A/V recording and communication device 1700, also known as a security device 1700. The A/V recording and communication device 1700 is an embodiment of the doorbell switches 404, 504, 704, and 1300, discussed above. An example A/V recording and communication security camera may include substantially all of the structure and/or functionality of the doorbells described herein, but without a front button and related components.

The A/V recording and communication device 1700 may be located near the entrance to a structure (not shown), such as a dwelling, a business, a storage facility, etc. The A/V recording and communication device 1700 includes a camera 1702, a microphone 1704, and a speaker 1706. The camera 1702 may include, for example, a high definition (HD) video camera, such as one configured for capturing video images at an image display resolution of 720p, or 1080p, or better. The camera 1702 may be an embodiment of the video camera 1312 discussed above. While not shown, the A/V recording and communication device 1700 may also include other hardware and/or components, such as a housing, a communication module (e.g., the modem 1306 discussed above, which may facilitate wired and/or wireless communication with other devices), one or more motion sensors (and/or other types of sensors), a button, etc. The A/V recording and communication device 1700 may further include similar componentry and/or functionality as the wireless communication doorbells described in U.S. Pat. No. 9,584,775 and U.S. patent application Ser. No. 2015/0022618 (application Ser. No. 14/334,922), respectively.

With further reference to FIG. 17, the A/V recording and communication device 1700 communicates with a user's network 1710, which may be for example a wired and/or wireless network. If the user's network 1710 is wireless, or includes a wireless component, the network 1710 may be a Wi-Fi network compatible with the IEEE 802.11 standard and/or other wireless communication standard(s). The user's network 1710 is connected to another network 1712, which may include, for example, the Internet and/or a public switched telephone network (PSTN). As described below, the A/V recording and communication device 1700 may communicate with the user's client device 1714 via the user's network 1710 and the network 1712 (Internet/PSTN). Alternatively, the A/V recording and communication device 1700 may communicate with the user's client device 1714 via the user's network 1710 (without the network 1712) and/or via a direct connection, such as over a short-range protocol connection (e.g., Bluetooth, BTLE, etc.) The user's client device 1714 may include, for example, a mobile telephone (may also be referred to as a cellular telephone), such as a smartphone, a personal digital assistant (PDA), or another communication device. The user's client device 1714 includes a display (not shown) and related components configured for displaying streaming and/or recorded video images. The user's client device 1714 may also include a speaker and related components configured for broadcasting streaming and/or recorded audio, and may also include a microphone. The A/V recording and communication device 1700 may also communicate with one or more remote storage device(s) 1716 (may be referred to interchangeably as "cloud storage device(s)"), one or more servers 1718, and/or a backend API (application programming interface) 1720 via the user's network 1710 and the network 1712 (Internet/PSTN). While FIG. 17 illustrates the storage device 1716, the server 1718, and the backend API 1720 as components separate from the network 1712, it is to be understood that the storage device 1716, the server 1718, and/or the backend API 1720 may be considered to be components of the network 1712.

The network 1712 may be any wireless network or any wired network, or a combination thereof, configured to operatively couple the above-mentioned modules, devices, and systems as shown in FIG. 17. For example, the network 1712 may include one or more of the following: a PSTN, the Internet, a local intranet, a PAN (Personal Area Network), a LAN (Local Area Network), a WAN (Wide Area Network), a MAN (Metropolitan Area Network), a virtual private network (VPN), a storage area network (SAN), a frame relay connection, an Advanced Intelligent Network (AIN) connection, a synchronous optical network (SONET) connection, a digital T1, T3, E1 or E3 line, a Digital Data Service (DDS) connection, a DSL (Digital Subscriber Line) connection, an Ethernet connection, an ISDN (Integrated Services Digital Network) line, a dial-up port such as a V.90, V.34, or V.34bis analog modem connection, a cable modem, an ATM (Asynchronous Transfer Mode) connection, or an FDDI (Fiber Distributed Data Interface) or CDDI (Copper Distributed Data Interface) connection. Furthermore, communications may also include links to any of a variety of wireless networks, including WAP (Wireless Application Protocol), GPRS (General Packet Radio Service), GSM (Global System for Mobile Communication), LTE, VoLTE, LoRaWAN, LPWAN, RPMA, LTE Cat-"X" (e.g., LTE Cat 1, LTE Cat 0, LTE CatM1, LTE Cat NB1), CDMA (Code Division Multiple Access), TDMA (Time Division Multiple Access), FDMA (Frequency Division Multiple Access), and/or OFDMA (Orthogonal Frequency Division Multiple Access) cellular phone networks, GPS, CDPD (cellular digital packet data), RIM (Research in Motion, Limited) duplex paging network, Bluetooth radio, or an IEEE 802.11-based radio frequency network. The network 1712 may further include or interface with any one or more of the following: RS-232 serial connection, IEEE-1394 (Firewire) connection, Fibre Channel connection, IrDA (infrared) port, SCSI (Small Computer Systems Interface) connection, USB (Universal Serial Bus) connection, or other wired or wireless, digital or analog, interface or connection, mesh or Digi® networking.

In certain embodiments, when a person (may be referred to interchangeably as "visitor") arrives at the A/V recording and communication device 1700, the A/V recording and communication device 1700 detects the visitor's presence and begins capturing video images within a field of view of camera 1702. The A/V recording and communication device 1700 may also capture audio through microphone 1704. The A/V recording and communication device 1700 may detect the visitor's presence by detecting motion using the camera 1702 and/or a motion sensor, and/or by detecting that the visitor has pressed a front button of the A/V recording and communication device 1700 (for example, when the A/V recording and communication device 1700 is a doorbell).

In response to the detection of the visitor, the A/V recording and communication device 1700 sends an alert to the user's client device 1714 (FIG. 17) via the user's network 1710 and the network 1712. The A/V recording and communication device 1700 also sends streaming video, and may also send streaming audio, to the user's client device 1714. If the user answers the alert, two-way audio communication may then occur between the visitor and the user through the A/V recording and communication device 1700 and the user's client device 1714. The user may view the visitor throughout the duration of the call, but the visitor cannot see the user (unless the A/V recording and communication device 1700 includes a display, which it may in certain embodiments).

The video images captured by the camera 1702 of the A/V recording and communication device 1700 (and the audio captured by the microphone 1704) may be uploaded to the cloud and recorded on the remote storage device 1716 (FIG. 17). In some embodiments, the video and/or audio may be recorded on the remote storage device 1716 even if the user chooses to ignore the alert sent to the user's client device 1714.

With further reference to FIG. 17, the system may further include a backend API 1720 including one or more components. A backend API (application programming interface) may include, for example, a server (e.g., a real server, or a virtual machine, or a machine running in a cloud infrastructure as a service), or multiple servers networked together, exposing at least one API to client(s) accessing it. These servers may include components such as application servers (e.g., software servers), depending upon what other components are included, such as a caching layer, or database layers, or other components. A backend API may, for example, include many such applications, each of which communicate with one another using their public APIs. In some embodiments, the API backend may hold the bulk of the user data and offer the user management capabilities, leaving the clients to have very limited state.

The backend API 1720 may include one or more APIs. An API is a set of routines, protocols, and tools for building software and applications. An API expresses a software component in terms of its operations, inputs, outputs, and underlying types, defining functionalities that are independent of their respective implementations, which allows definitions and implementations to vary without compromising the interface. Advantageously, an API may provide a programmer with access to an application's functionality without the programmer needing to modify the application itself, or even understand how the application works. An API may be for a web-based system, an operating system, or a database system, and it provides facilities to develop applications for that system using a given programming language. In addition to accessing databases or computer hardware like hard disk drives or video cards, an API can ease the work of programming GUI components. For example, an API can facilitate integration of new features into existing applications (a so-called "plug-in API"). An API can also assist otherwise distinct applications with sharing data, which can help to integrate and enhance the functionalities of the applications.

The backend API 1720 may further include one or more services (also referred to as network services). A network service is an application that provides data storage, manipulation, presentation, communication, and/or other capability. Network services are often implemented using a client-server architecture based on application-layer network protocols. Each service may be provided by a server component running on one or more computers (such as a dedicated server computer offering multiple services) and accessed via a network by client components running on other devices. However, the client and server components can both be run on the same machine. Clients and servers may have a user interface, and sometimes other hardware associated with them.

The A/V recording device 1700 may include any of the features discussed above with respect to doorbell switches 404, 504, 704, and 1300 to manage power and control of the doorbell sound output device 406.

Figure 18:
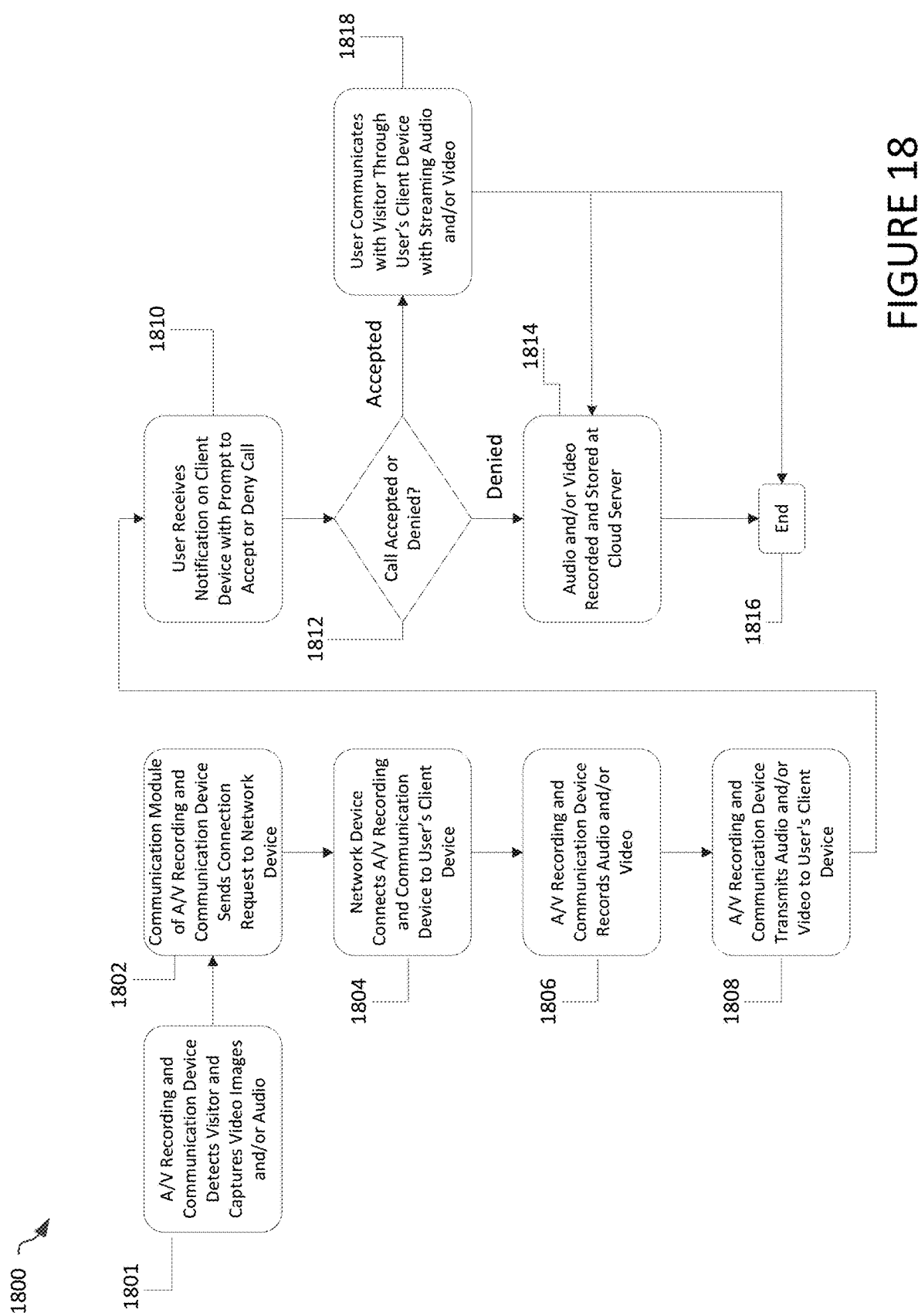
FIG. 18 is a flowchart illustrating a process for streaming and storing A/V content from the device of FIG. 17, according to an embodiment.

FIG. 18 is a flowchart illustrating a process 1800 for streaming and storing A/V content from the A/V recording and communication device 1700, in an embodiment. At block 1801, the A/V recording and communication device 1700 detects the visitor's presence and captures video images within a field of view of the camera 1702. The A/V recording and communication device 1700 may also capture audio through the microphone 1704. As described above, the A/V recording and communication device 1700 may detect the visitor's presence by detecting motion using the camera 1702 and/or a motion sensor, and/or by detecting that the visitor has pressed a front button of the A/V recording and communication device 1700 (for example, when the A/V recording and communication device 1700 is a doorbell). Also as described above, the video recording/capture may begin when the visitor is detected, or may begin earlier, as described below.

At block 1802, a communication module of the A/V recording and communication device 1700 sends a connection request, via the user's network 1710 and the network 1712, to a device in the network 1712. For example, the network device to which the connection request is sent may be a server such as the server 1718. The server 1718 may include a computer program and/or a machine that waits for requests from other machines or software (clients) and responds to them. A server typically processes data. One purpose of a server is to share data and/or hardware and/or software resources among clients. This architecture is called the client-server model. The clients may run on the same computer or may connect to the server over a network. Examples of computing servers include database servers, file servers, mail servers, print servers, web servers, game servers, and application servers. The term server may be construed broadly to include any computerized process that shares a resource to one or more client processes. In another example, the network device to which the request is sent may be an API such as the backend API 1720, which is described above.

In response to the request, at block 1804 the network device may connect the A/V recording and communication device 1700 to the user's client device 1714 through the user's network 1710 and the network 1712. At block 1806, the A/V recording and communication device 1700 may record available audio and/or video data using the camera 1702, the microphone 1704, and/or any other device/sensor available. At block 1808, the audio and/or video data is transmitted (streamed) from the A/V recording and communication device 1700 to the user's client device 1714 via the user's network 1710 and the network 1712. At block 1810, the user may receive a notification on the user's client device 1714 with a prompt to either accept or deny the call.

At block 1812, the process 1800 determines whether the user has accepted or denied the call. If the user denies the notification, then the process 1800 advances to block 1814, where the audio and/or video data is recorded and stored at a cloud server. The session then ends at block 1816 and the connection between the A/V recording and communication device 1700 and the user's client device 1714 is terminated. If, however, the user accepts the notification, the process 1800 proceeds with block 1818 where the user communicates with the visitor through the user's client device 1714 while audio and/or video data captured by the camera 1702, the microphone 1704, and/or other devices/sensors, is streamed to the user's client device 1714. At the end of the call, the user may terminate the connection between the user's client device 1714 and the A/V recording and communication device 1700 and the session ends at block 1816. In some embodiments, the audio and/or video data may be recorded and stored at a cloud server (block 1814) even if the user accepts the notification and communicates with the visitor through the user's client device 1714.

Figure 19:
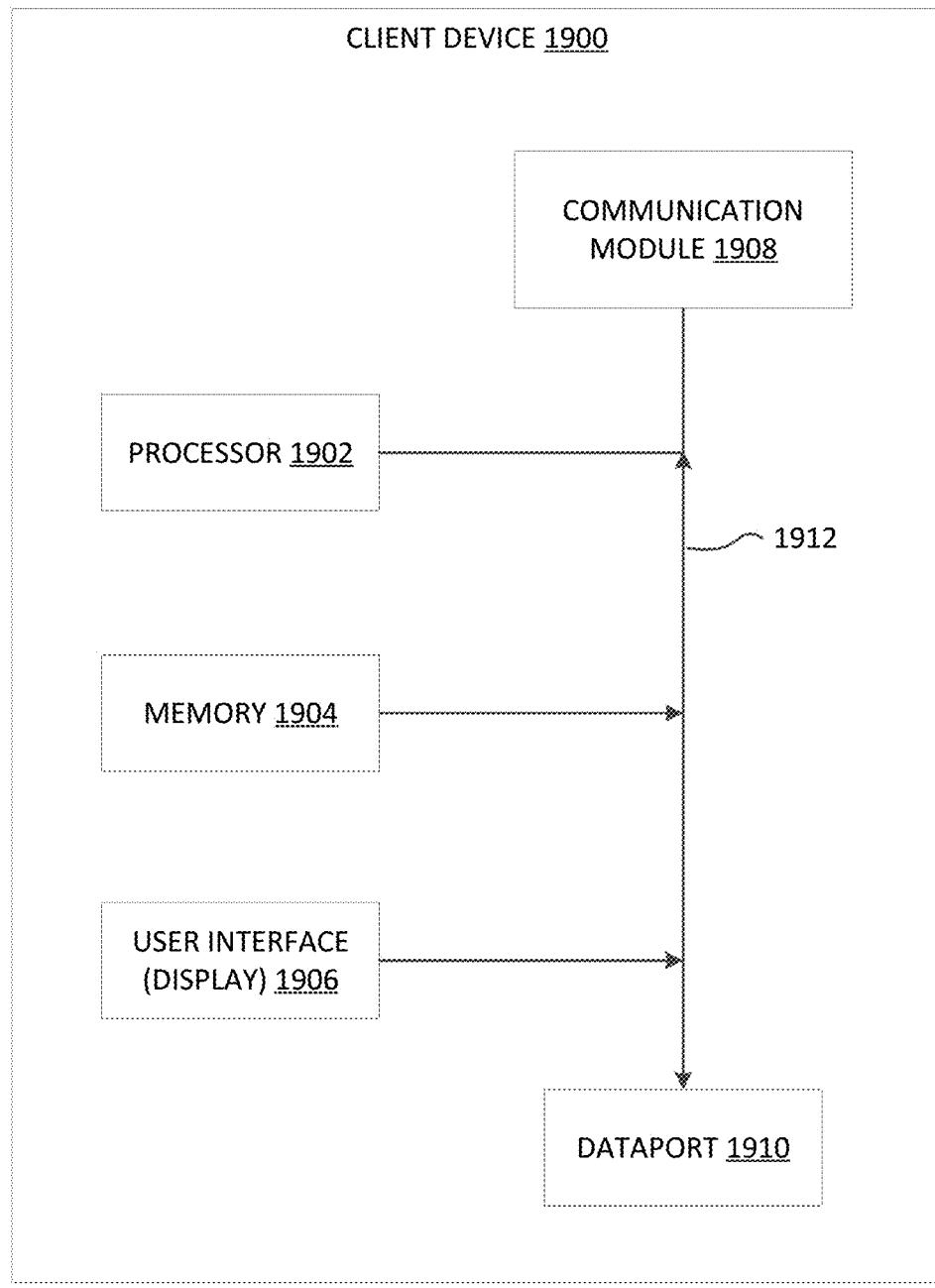
FIG. 19 is a functional block diagram of a client device on which the present embodiments may be implemented according to various aspects of the present disclosure.

FIG. 19 is a functional block diagram of a client device 1900 on which the present embodiments may be implemented according to various aspects of the present disclosure. The user's client device 1714 described with reference to FIG. 17 may include some or all of the components and/or functionality of the client device 1900. The client device 1900 may be, for example, a smartphone.

The client device 1900 includes a processor 1902, a memory 1904, a user interface 1906, a communication module 1908, and a dataport 1910. These components are communicatively coupled together by an interconnect bus 1912. The processor 1902 may include any processor used in smartphones and/or portable computing devices, such as an ARM processor (a processor based on the RISC (reduced instruction set computer) architecture developed by Advanced RISC Machines (ARM).). In certain embodiments, the processor 1902 includes one or more other processors, such as one or more microprocessors, and/or one or more supplementary co-processors, such as math co-processors.

The memory 1904 may include both operating memory, such as random access memory (RAM), as well as data storage, such as read-only memory (ROM), hard drives, flash memory, or any other suitable memory/storage element. The memory 1904 may include removable memory elements, such as a CompactFlash card, a MultiMediaCard (MMC), and/or a Secure Digital (SD) card. In certain embodiments, the memory 1904 includes a combination of magnetic, optical, and/or semiconductor memory, and may include, for example, RAM, ROM, flash drive, and/or a hard disk or drive. The processor 1902 and the memory 1904 each may be located entirely within a single device, or may be connected to each other by a communication medium, such as a USB port, a serial port cable, a coaxial cable, an Ethernet-type cable, a telephone line, a radio frequency transceiver, or other similar wireless or wired medium or combination of the foregoing. For example, the processor 1902 may be connected to the memory 1904 via the dataport 1910.

The user interface 1906 may include any user interface or presentation elements suitable for a smartphone and/or a portable computing device, such as a keypad, a display screen, a touchscreen, a microphone, and a speaker. The communication module 1908 is configured to handle communication links between the client device 1900 and other, external devices or receivers, and to route incoming/outgoing data appropriately. For example, inbound data from the dataport 1910 may be routed through the communication module 1908 before being directed to the processor 1902, and outbound data from the processor 1902 may be routed through the communication module 1908 before being directed to the dataport 1910. The communication module 1908 may include one or more transceiver modules configured for transmitting and receiving data, and using, for example, one or more protocols and/or technologies, such as GSM, UMTS (3GSM), IS-95 (CDMA one), IS-2000 (CDMA 2000), LTE, FDMA, TDMA, W-CDMA, CDMA, OFDMA, Wi-Fi, WiMAX, or any other protocol and/or technology.

The dataport 1910 may be any type of connector used for physically interfacing with a smartphone and/or a portable computing device, such as a mini-USB port or an IPHONE®/IPOD® 30-pin connector or LIGHTNING® connector. In other embodiments, the dataport 1910 may include multiple communication channels for simultaneous communication with, for example, other processors, servers, and/or client terminals.

The memory 1904 may store instructions for communicating with other systems, such as a computer. The memory 1904 may store, for example, a program (e.g., computer program code) adapted to direct the processor 1902 in accordance with the present embodiments. The instructions also may include program elements, such as an operating system. While execution of sequences of instructions in the program causes the processor 1902 to perform the process steps described herein, hard-wired circuitry may be used in place of, or in combination with, software/firmware instructions for implementation of the processes of the present embodiments. Thus, the present embodiments are not limited to any specific combination of hardware and software.

System/Device

Figure 20:
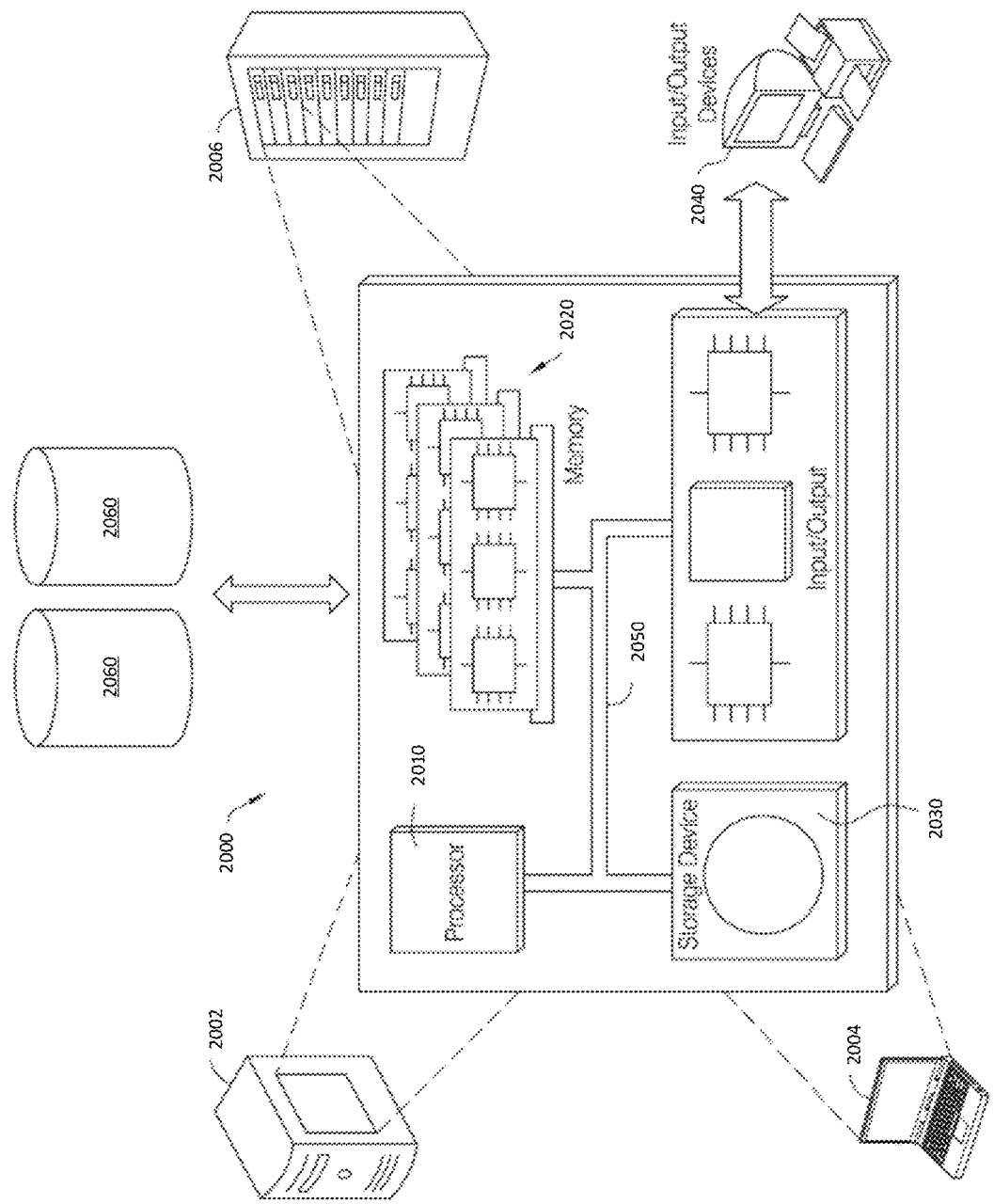
FIG. 20 is a functional block diagram of a system on which the present embodiments may be implemented according to various aspects of present disclosure.

FIG. 20 is a functional block diagram of a system 2000 on which the present embodiments may be implemented according to various aspects of the present disclosure. For example, aspects of the system 2000 may be an example of the doorbell switch 404, 504, 704, and 1300, the doorbell sound output device controller 408, 608, 808, 1108, and 1208, and the A/V recording and communication device 1700. The computer system 2000 may be embodied in at least one of a personal computer (also referred to as a desktop computer) 2002, a portable computer (also referred to as a laptop or notebook computer) 2004, and/or a server 2006. A server is a computer program and/or a machine that waits for requests from other machines or software (clients) and responds to them. A server typically processes data. The purpose of a server is to share data and/or hardware and/or software resources among clients. This architecture is called the client-server model. The clients may run on the same computer or may connect to the server over a network. Examples of computing servers include database servers, file servers, mail servers, print servers, web servers, game servers, and application servers. The term server may be construed broadly to include any computerized process that shares a resource to one or more client processes.

The computer system 2000 may execute at least some of the operations described above. The computer system 2000 may include at least one processor 2010, a memory 2020, at least one storage device 2030, and input/output (I/O) devices 2040. Some or all of the components 2010, 2020, 2030, 2040 may be interconnected via a system bus 2050. The processor 2010 may be single- or multi-threaded and may have one or more cores. The processor 2010 may execute instructions, such as those stored in the memory 2020 and/or in the storage device 2030. Information may be received and output using one or more of the I/O devices 2040.

The memory 2020 may store information, and may be a computer-readable medium, such as volatile or non-volatile memory. The storage device(s) 2030 may provide storage for the computer system 2000, and may be a computer-readable medium. In various embodiments, the storage device(s) 2030 may be one or more of a flash memory device, a hard disk device, an optical disk device, a tape device, or any other type of storage device.

The I/O devices 2040 may provide input/output operations for the computer system 2000. The I/O devices 2040 may include a keyboard, a pointing device, and/or a microphone. The I/O devices 2040 may further include a display unit for displaying graphical user interfaces, a speaker, and/or a printer. External data may be stored in one or more accessible external databases 2060.

The features of the present embodiments described herein may be implemented in digital electronic circuitry, and/or in computer hardware, firmware, software, and/or in combinations thereof. Features of the present embodiments may be implemented in a computer program product tangibly embodied in an information carrier, such as a machine-readable storage device, and/or in a propagated signal, for execution by a programmable processor. Embodiments of the present method steps may be performed by a programmable processor executing a program of instructions to perform functions of the described implementations by operating on input data and generating output.

The features of the present embodiments described herein may be implemented in one or more computer programs that are executable on a programmable system including at least one programmable processor coupled to receive data and/or instructions from, and to transmit data and/or instructions to, a data storage system, at least one input device, and at least one output device. A computer program may include a set of instructions that may be used, directly or indirectly, in a computer to perform a certain activity or bring about a certain result. A computer program may be written in any form of programming language, including compiled or interpreted languages, and it may be deployed in any form, including as a stand-alone program or as a module, component, subroutine, or other unit suitable for use in a computing environment.

Suitable processors for the execution of a program of instructions may include, for example, both general and special purpose processors, and/or the sole processor or one of multiple processors of any kind of computer. Generally, a processor may receive instructions and/or data from a read only memory (ROM), or a random access memory (RAM), or both. Such a computer may include a processor for executing instructions and one or more memories for storing instructions and/or data.

Generally, a computer may also include, or be operatively coupled to communicate with, one or more mass storage devices for storing data files. Such devices include magnetic disks, such as internal hard disks and/or removable disks, magneto-optical disks, and/or optical disks. Storage devices suitable for tangibly embodying computer program instructions and/or data may include all forms of non-volatile memory, including for example semiconductor memory devices, such as EPROM, EEPROM, and flash memory devices, magnetic disks such as internal hard disks and removable disks, magneto-optical disks, and CD-ROM and DVD-ROM disks. The processor and the memory may be supplemented by, or incorporated in, one or more ASICs (application-specific integrated circuits).

To provide for interaction with a user, the features of the present embodiments may be implemented on a computer having a display device, such as an LCD (liquid crystal display) monitor, for displaying information to the user. The computer may further include a keyboard, a pointing device, such as a mouse or a trackball, and/or a touchscreen by which the user may provide input to the computer.

The features of the present embodiments may be implemented in a computer system that includes a back-end component, such as a data server, and/or that includes a middleware component, such as an application server or an Internet server, and/or that includes a front-end component, such as a client computer having a graphical user interface (GUI) and/or an Internet browser, or any combination of these. The components of the system may be connected by any form or medium of digital data communication, such as a communication network. Examples of communication networks may include, for example, a LAN (local area network), a WAN (wide area network), and/or the computers and networks forming the Internet.

The computer system may include clients and servers. A client and server may be remote from each other and interact through a network, such as those described herein. The relationship of client and server may arise by virtue of computer programs running on the respective computers and having a client-server relationship to each other.

Example Embodiments

Figure 21:
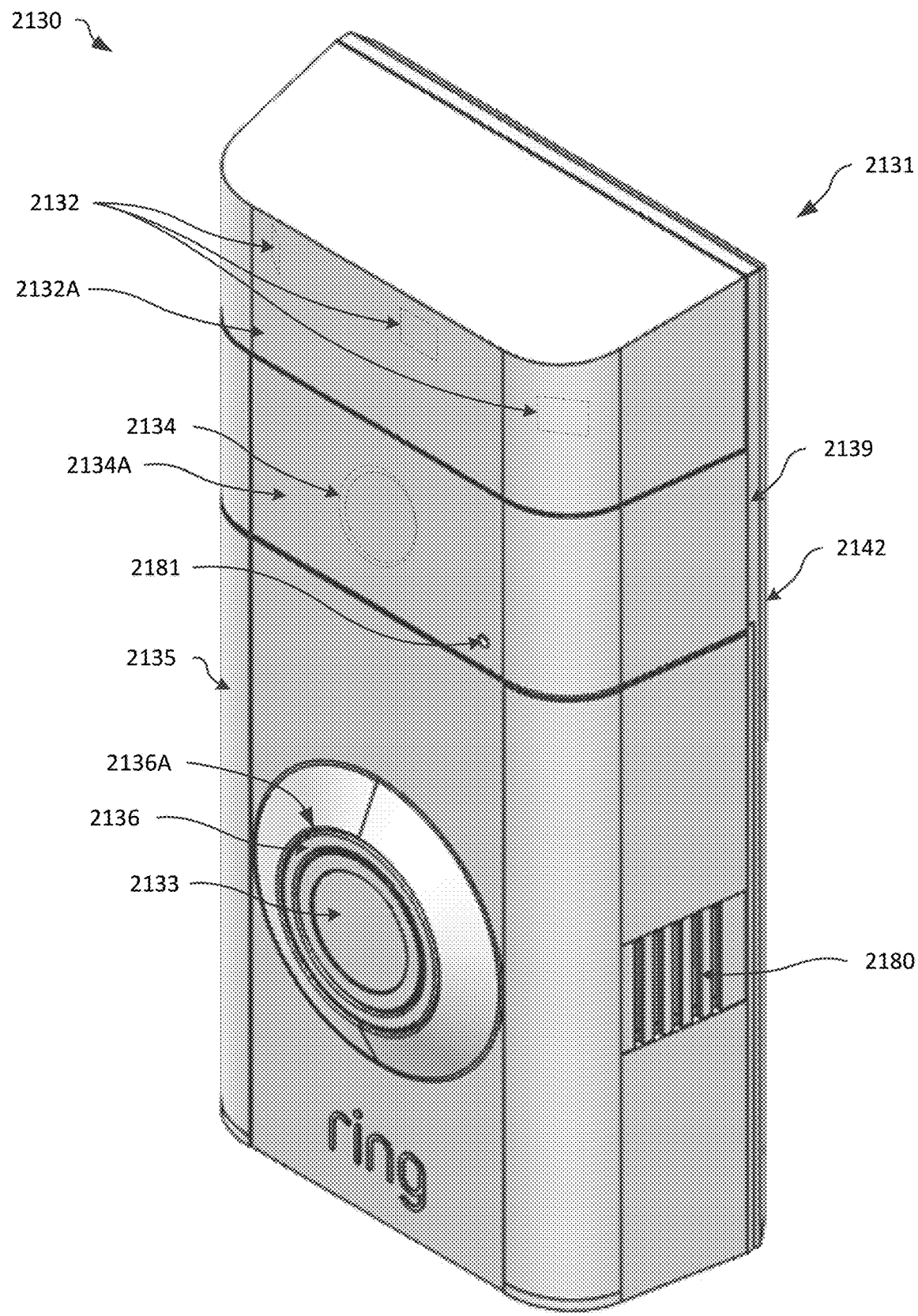
FIG. 21 is a front perspective view of the device of FIG. 17 implemented as a doorbell, in an embodiment.

FIG. 21 is a front perspective view of a doorbell 2130 that represents one example implementation of the security device 1700 of FIG. 17 and the above discussed doorbell switches 404, 504, 704, and 1300, hereafter referred to as device 2130. The device 2130 has a housing 2131 that includes a backplate 2139, a faceplate 2135 with a button 2133, an optically-transparent lens 2134A positioned in front of a camera 2134, and an infrared-transparent lens 2132A positioned in front of at least one motion sensor 2132. The housing 2131 may be further configured with an aperture 2181 to allow sound to enter the housing 2131 for detection by a microphone. The device 2130 may also include a mounting bracket 2142 that couples with the backplate 2139 to facilitate mounting of the device 2130 on a flat surface, such as the exterior of a building, such as a home or office. For example, the mounting bracket 2142 may be selected for mounting to surfaces of various composition, including, without limitation, wood, concrete, stucco, brick, vinyl siding, aluminum siding, etc., with any suitable fasteners, such as screws, or interference connections, adhesives, etc. The device 2130 may couple to the mounting bracket 2142 using any suitable fasteners, such as screws, or interference connections, mating hooks and apertures, adhesives, etc. The backplate 2139 may include screw terminals configured to receive electrical wires adjacent a mounting surface of the device 2130. The device 2130 may receive electrical power through the screw terminals and/or the device 2130 may control electrical connectivity of the screw terminals to cause a conventional doorbell to sound if so connected to the wires.

The faceplate 2135 may extend from the bottom of the device 2130 up to just below the camera 2134. The faceplate 2135 may be formed of any suitable material, including, without limitation, metals, such as brushed aluminum or stainless steel, metal alloys, and plastics, and any combination thereof. The faceplate 2135 protects the internal contents of the device 2130 and serves as an exterior front surface of the device 2130. The faceplate 2135 may include an aperture 2136A with a flexible translucent membrane 2136 for movably holding the button 2133. The faceplate 2135 is also formed with at least one speaker grille 2180 to allow sound generated within the housing 2131 to exit. The button 2133 and the flexible translucent membrane 2136 may have various profiles that may or may not match the profile of the faceplate 2135. The flexible translucent membrane 2136 may include any suitable material, including, without limitation, a transparent silicone, plastic, or rubber, that is configured for allowing light produced within the device 2130 to pass through and is sufficiently flexible to allow the button 2133 to be pressed. The light may be produced by one or more light-emitting components, such as light-emitting diodes (LEDs), contained within the device 2130, as further described below. The button 2133 and/or the flexible translucent membrane 2136 contacts a switch cover located within the device 2130 when the button 2133 is pressed by a visitor. When pressed, the button 2133 may trigger one or more functions of the device 2130, as further described below.

The motion sensor 2132 may be, for example, one or more passive infrared (PIR) sensors that detect motion using the infrared wavelength, but may be any type of sensor configured for detecting and communicating the presence of motion and/or a heat source within their field of view. The motion sensor 2132 may be configured to detect motion using any methodology, including but not limited to methodologies that do not rely on detecting the presence of a heat source within a field of view, without departing from the scope of the present embodiments. In certain embodiments, the infrared-transparent lens 2132A may be a Fresnel lens patterned to focus incoming light onto the at least one motion sensor 2132 located within the device 2130. The infrared transparent lens 2132A may be substantially coplanar with a front surface of the housing 2131. In alternative embodiments, the infrared-transparent lens 2132A may be recessed within the housing 2131 or may protrude outward from the housing 2131. The infrared-transparent lens 2132A may extend and curl partially around the side of the device 2130 without departing from the scope of the present embodiments. The at least one motion sensor 2132 is configured to sense a presence and/or motion of an object in front of the device 2130. In certain embodiments, the optically-transparent lens 2134A may be configured for focusing light into the camera 2134 so that clear images may be taken. The camera 2134 is configured for capturing video data when activated.

Changes may be made in the above methods, devices, and systems without departing from the scope of the present embodiments. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A doorbell system, comprising:
a doorbell sound output device controller configured to control flow of electrical power from a transformer to a doorbell sound output device;
wiring; and
a doorbell switch that is separate from the doorbell sound output device controller, the doorbell switch being electrically coupled in parallel with the doorbell sound output device controller via the wiring, the doorbell switch including:
power supply circuitry electrically coupled across the wiring, the power supply circuitry operable to receive input electrical power via the wiring, to electrically power the doorbell switch;
an input device; and
activation circuitry electrically coupled across the wiring, the activation circuitry including a transmitter operably connected to the input device such that, when the input device receives an input to activate the doorbell sound output device, the transmitter generates an activation signal on the wiring, without interfering with ability of the power supply circuitry to receive input electrical power via the wiring, the activation signal being selected from the group consisting of a simple tone and a modulated tone.

2. The doorbell system of claim 1, wherein the activation circuitry and the power supply circuitry are electrically coupled in parallel with the wiring.

3. The doorbell system of claim 1, wherein the transmitter generates the activation signal such that the activation signal is a differential signal on the wiring.

4. The doorbell system of claim 1, wherein the input device comprises a touch-activated switch.

5. The doorbell system of claim 1, wherein the doorbell switch further includes a video camera that generates video image data representing a scene proximate to the doorbell switch.

6. The doorbell system of claim 1, wherein the doorbell switch further includes a microphone that generates sound data representing sound proximate to the doorbell switch.

7. A doorbell system, comprising:
a doorbell sound output device controller configured to control flow of electrical power from a transformer to a doorbell sound output device;
wiring; and
a doorbell switch that is separate from the doorbell sound output device controller, the doorbell switch being electrically coupled in parallel with the doorbell sound output device controller via the wiring, the doorbell switch including:
power supply circuitry that receives input electrical power via the wiring to electrically power the doorbell switch;
an input device; and
perturbation circuitry including a perturbation switching device and an impedance device electrically coupled in series across the wiring, the perturbation circuitry operably connected to the input device such that, when the input device receives an input to activate the doorbell sound output device, the perturbation circuitry generates an activation signal on the wiring by closing the switching device to change electrical current flowing through the wiring, without interfering with ability of the power supply circuitry to receive input electrical power via the wiring.

8. The doorbell system of claim 7, wherein the doorbell switch further includes activation circuitry including the perturbation circuitry, wherein the activation circuitry and the power supply circuitry are electrically coupled in parallel with the wiring.

9. The doorbell system of claim 7, wherein the impedance device comprises one or more resistors.

10. The doorbell system of claim 7, wherein the input device comprises a touch-activated switch.

11. The doorbell system of claim 7, wherein the doorbell switch further includes a video camera that generates video image data representing a scene proximate to the doorbell switch.

12. The doorbell system of claim 7, wherein the doorbell switch further includes a microphone that generates sound data representing sound proximate to the doorbell switch.

13. A method for operating a doorbell sound output device, the method comprising:
    receiving input electrical power at power supply circuitry of a doorbell switch, via wiring electrically coupling the doorbell switch in parallel with a doorbell sound output device controller external to the doorbell switch;
    powering the doorbell switch from the power supply circuitry;
    receiving a command input at the doorbell switch;
    in response to receiving the command input, generating a tone on the wiring electrically coupling the doorbell switch in parallel with the doorbell sound output device controller while receiving input electrical power at the power supply circuitry via the wiring electrically coupling the doorbell switch in parallel with the doorbell sound output device controller, the tone being selected from the group consisting of a simple tone and a modulated tone;
    receiving the tone at the doorbell sound output device controller; and
    in response to receiving the tone at the doorbell sound output device controller, enabling flow of electrical current between the doorbell sound output device controller and the doorbell sound output device.

14. The method of claim 13, wherein the tone is a differential signal on the wiring electrically coupling the doorbell switch in parallel with the doorbell sound output device controller.

15. The method of claim 13, further comprising detecting, at the doorbell sound output device controller, a signal having a frequency of the tone.

16. The method of claim 13, further comprising filtering the tone from other signals received at the doorbell sound output device controller.

17. The method of claim 13, further comprising:
    operating a switching device in a conductive state to enable flow of electrical current between the doorbell sound output device controller and the doorbell sound output device;
    receiving, at the doorbell sound output device controller, a configuration command; and
    adjusting, in response to the configuration command, a duration that the switching device operates in its conductive state.

* * * * *